United States Patent
Lee et al.

(10) Patent No.: US 11,417,631 B2
(45) Date of Patent: Aug. 16, 2022

(54) SEMICONDUCTOR PACKAGE

(71) Applicant: SAMSUNG ELECTRO-MECHANICS CO., LTD., Suwon-si (KR)

(72) Inventors: Yun Tae Lee, Suwon-si (KR); Hyung Joon Kim, Suwon-si (KR); Han Kim, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 289 days.

(21) Appl. No.: 16/522,112

(22) Filed: Jul. 25, 2019

(65) Prior Publication Data

US 2020/0365558 A1    Nov. 19, 2020

(30) Foreign Application Priority Data

May 13, 2019    (KR) .......................... 10-2019-0055468

(51) Int. Cl.
*H01L 25/065*    (2006.01)
*H01L 23/055*    (2006.01)
(Continued)

(52) U.S. Cl.
CPC ........ *H01L 25/0657* (2013.01); *H01L 23/055* (2013.01); *H01L 23/13* (2013.01);
(Continued)

(58) Field of Classification Search
CPC ... H01L 25/0657; H01L 23/13; H01L 23/481; H01L 23/5383; H01L 23/5389;
(Continued)

(56) References Cited

U.S. PATENT DOCUMENTS 8,937,381 B1 * 1/2015 Dunlap .............. H01L 23/5389
257/784
9,373,605 B1    6/2016 Wang et al.
(Continued)

FOREIGN PATENT DOCUMENTS

KR    10-2010-0105506 A    9/2010
KR    10-1301838 B1    8/2013
(Continued)

OTHER PUBLICATIONS

Taiwanese Office Action Report dated Jun. 8, 2022, issued in corresponding Taiwanese Patent Application No. 108126519 (with English Translation).

*Primary Examiner* — Benjamin Tzu-Hung Liu
(74) *Attorney, Agent, or Firm* — Morgan, Lewis & Bockius LLP

(57) ABSTRACT

A semiconductor package includes: a first semiconductor package including: a first frame having a first through portion, a first semiconductor chip in the first through portion and having a first surface on which a first connection pad is disposed and a second surface on which a second connection pad is disposed, and a through via connected to the second connection pad, a first connection structure on the first surface and including a first redistribution layer, and a backside redistribution layer on the second surface; and a second semiconductor package on the first semiconductor package and including: a second connection structure including a second redistribution layer, a second frame on the second connection structure and having a second through portion, and a second semiconductor chip in a second through portion and having a third surface on which a third connection pad is disposed.

21 Claims, 15 Drawing Sheets

(51) Int. Cl.
*H01L 23/13* (2006.01)
*H01L 23/48* (2006.01)
*H01L 23/538* (2006.01)
*H01L 23/00* (2006.01)
*H01L 25/10* (2006.01)
*H01L 25/16* (2006.01)

(52) U.S. Cl.
CPC ........ *H01L 23/481* (2013.01); *H01L 23/5383* (2013.01); *H01L 23/5384* (2013.01); *H01L 23/5389* (2013.01); *H01L 24/08* (2013.01); *H01L 25/105* (2013.01); *H01L 25/16* (2013.01); *H01L 2224/08225* (2013.01)

(58) Field of Classification Search
CPC ... H01L 23/055; H01L 23/5384; H01L 25/16; H01L 25/105; H01L 24/08; H01L 2224/08225; H01L 24/32; H01L 24/48; H01L 24/73; H01L 2224/04105; H01L 2225/06506; H01L 2225/0651; H01L 2225/06568; H01L 2225/1094; H01L 2924/3025; H01L 2224/32145; H01L 2224/32225; H01L 2224/48227; H01L 2224/48091; H01L 2224/73265; H01L 2924/15311; H01L 25/18; H01L 2224/2518; H01L 24/20; H01L 2225/1035; H01L 2225/1058; H01L 2224/12105; H01L 2924/3511; H01L 23/3128; H01L 23/49816; H01L 24/02; H01L 24/11; H01L 24/13; H01L 21/56; H01L 2224/02331; H01L 2224/02379; H01L 2224/02381; H01L 2224/031; H01L 2224/111; H01L 2224/13008; H01L 23/49827; H01L 23/525; H01L 23/528; H01L 24/06
See application file for complete search history.

(56) References Cited

U.S. PATENT DOCUMENTS

| | | | |
|---|---|---|---|
| 9,679,801 B2 | 6/2017 | Lai et al. | |
| 2008/0174008 A1 | 7/2008 | Yang et al. | |
| 2010/0237481 A1 | 9/2010 | Chi et al. | |
| 2013/0241025 A1* | 9/2013 | Pagani | H01L 24/09 438/584 |
| 2016/0338202 A1* | 11/2016 | Park | H01L 23/5389 |
| 2016/0358889 A1* | 12/2016 | Lai | H01L 23/5384 |
| 2017/0018476 A1* | 1/2017 | Wang | H01L 25/105 |
| 2017/0133351 A1 | 5/2017 | Su et al. | |
| 2017/0141088 A1 | 5/2017 | Zhai et al. | |
| 2017/0243826 A1* | 8/2017 | Lin | H01L 23/3114 |
| 2017/0287796 A1 | 10/2017 | Lee et al. | |
| 2018/0350747 A1 | 12/2018 | Hwang et al. | |
| 2019/0131277 A1 | 5/2019 | Yang et al. | |
| 2019/0206824 A1* | 7/2019 | Lu | H01L 21/568 |
| 2019/0348340 A1* | 11/2019 | Kwon | H01L 23/10 |
| 2020/0051999 A1* | 2/2020 | Delacruz | H01L 25/0652 |
| 2020/0083137 A1* | 3/2020 | Park | H01L 24/09 |

FOREIGN PATENT DOCUMENTS

| | | |
|---|---|---|
| TW | 201705314 A | 2/2017 |
| TW | 201730989 A | 9/2017 |
| TW | 201801286 A | 1/2018 |
| TW | 201904002 A | 1/2019 |

\* cited by examiner

SEMICONDUCTOR PACKAGE

CROSS-REFERENCE TO RELATED APPLICATION

This application claims benefit of priority to Korean Patent Application No. 10-2019-0055468 filed on May 13, 2019 in the Korean Intellectual Property Office, the disclosure of which is incorporated herein by reference in its entirety.

TECHNICAL FIELD

The present disclosure relates to a semiconductor package, for example, to a fan-out semiconductor package.

BACKGROUND

As smart electronic devices have been developed in recent years, specifications of components used in the device have also advanced. For example, specifications of an application processor (AP), a key component of a smart electronic device, have rapidly advanced. Various methods have been used for advanced performance of the AP, and a functional partitioning of the AP is one recent method. For example, when partitioning a semiconductor chip die of the AP for each function, and then designing and packaging each semiconductor chip to be optimized for process and features thereof, the AP may implement more advanced performance than a conventional single AP. However, in this case, a high-level packaging method is required. Therefore, there is demand for a semiconductor package structure in which a plurality of partitioned semiconductor chips may be packaged to have optimal signal and power characteristics.

SUMMARY

An aspect of the present disclosure may provide a new type of a semiconductor package having a structure in which a plurality of semiconductor chips may be packaged to have optimal signal and power characteristics.

According to an aspect of the present disclosure, there may be provided a semiconductor package having a structure in which a plurality of semiconductor chips are disposed after being partitioned into upper and lower packages based on specifications thereof and then the semiconductor chip of the lower package transmits power to the semiconductor chip of the upper package through a through via penetrating through the semiconductor chip of the lower package.

According to an aspect of the present disclosure, a semiconductor package may include: a the first semiconductor package including: a first frame having a first through portion, a first semiconductor chip disposed in the first through portion of the first frame and having a first surface on which a first connection pad is disposed and a second surface opposing the first surface and on which a second connection pad is disposed, and a through via connected to the second connection pad, a first connection structure disposed on the first surface of the first semiconductor chip and including a first redistribution layer electrically connected to the first connection pad of the first semiconductor chip, and a backside redistribution layer disposed on the second surface of the first semiconductor chip and electrically connected to the second connection pad of the first semiconductor chip; and a second semiconductor package disposed on the first semiconductor package and including: a second connection structure including a second redistribution layer electrically connected to the first redistribution layer, a second frame disposed on the second connection structure and having a second through portion, and a second semiconductor chip disposed in a second through portion of the second frame and having a third surface on which a third connection pad is disposed, the third connection pad electrically connected to the second redistribution layer.

BRIEF DESCRIPTION OF DRAWINGS

The above and other aspects, features and other advantages of the present disclosure are more clearly understood from the following detailed description taken in conjunction with the accompanying drawings, in which.

DETAILED DESCRIPTION

Embodiments of the present disclosure are hereinafter described in detail with reference to the accompanying drawings. In the accompanying drawings, shapes, sizes and the like of components may be exaggerated or shortened for clarity.

Herein, a lower side, a lower portion, a lower surface and the like, are used to refer to a direction toward a mounting surface of the fan-out semiconductor package with respect to cross sections of the drawings, while an upper side, an upper portion, an upper surface and the like, are used to refer to the opposite direction. However, these directions are defined for convenience of explanation, and the claims are not particularly limited by the directions defined as described above The meaning of a "connection" of a component to another component in the description conceptually includes an indirect connection through an adhesive layer as well as a direct connection between two components. In addition, "electrically connected" conceptually includes a physical connection and a physical disconnection. It is to be understood that when an element is referred to with terms such as "first" and "second", the element is not limited thereby. They may be used only for a purpose of distinguishing the element from the other elements, and may not limit the sequence or importance of the elements. In some cases, a first element may be referred to as a second element without departing from the scope of the claims set forth herein. Similarly, a second element may also be referred to as a first element.

The term "an embodiment" used herein does not refer to the same embodiment, and is provided to emphasize a particular feature or characteristic different from that of another embodiment. However, embodiments provided herein are considered to be able to be implemented by being combined in whole or in part one with each other. For example, one element described in a particular embodiment, even if it is not described in another embodiment, may be understood as a description related to another embodiment, unless an opposite or contradictory description is provided therein.

Terms used herein are used only in order to describe an embodiment rather than limiting the present disclosure. In this case, singular forms include plural forms unless interpreted otherwise in context.

Electronic Device

Figure 1:
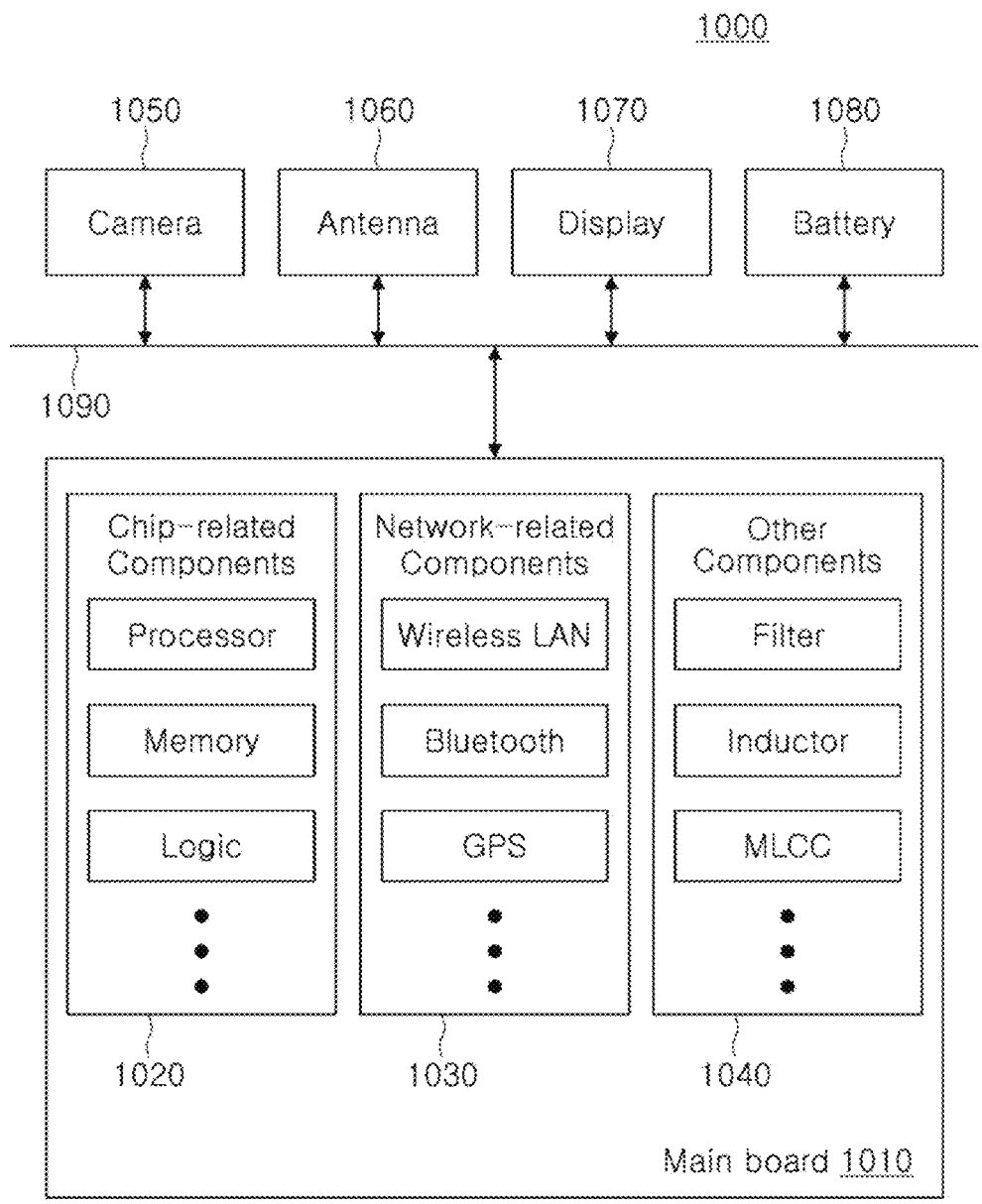
FIG. 1 is a schematic block diagram illustrating an example of an electronic device system.

FIG. 1 is a schematic block diagram illustrating an example of an electronic device system.

Referring to FIG. 1, an electronic device 1000 may accommodate a main board 1010 therein. In the main board 1010, chip-related components 1020, network-related components 1030, other components 1040 and the like are physically and/or electrically connected to each other. These components may be connected to other components to be described below to form various signal lines 1090.

The chip-related components 1020 may include: a memory chip such as a volatile memory (for example, a dynamic random access memory (DRAM)), a non-volatile memory (for example, a read only memory (ROM)), a flash memory or the like; an application processor chip such as a central processor (for example, a central processing unit (CPU)), a graphics processor (for example, a graphics processing unit (GPU)), a digital signal processor, a cryptographic processor, a microprocessor, a microcontroller or the like; and a logic chip such as an analog-to-digital (ADC) converter, an application-specific integrated circuit (ASIC) or the like. However, the chip-related components 1020 are not limited thereto, and may also include other types of chip-related components. In addition, the chip-related components 1020 may be combined with each other.

The network-related components 1030 may include protocols such as wireless fidelity (Wi-Fi) (Institute of Electrical and Electronics Engineers (IEEE) 802.11 family or the like), worldwide interoperability for microwave access (WiMAX) (IEEE 802.16 family or the like), IEEE 802.20, long term evolution (LTE), evolution data only (Ev-DO), high speed packet access+(HSPA+), high speed downlink packet access+(HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols, designated after the abovementioned protocols. However, the network-related components 1030 are not limited thereto, and may also include a variety of other wireless or wired standards or protocols. In addition, the network-related components 1030 may be combined with each other, together with the chip-related components 1020 described above.

The other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC) or the like. However, other components 1040 are not limited thereto, and may also include passive components used for various other purposes or the like. In addition, other components 1040 may be combined with each other, together with the chip-related components 1020 and/or the network-related components 1030 described above.

Depending on type of the electronic device 1000, the electronic device 1000 may include other components that may or may not be physically and/or electrically connected to the main board 1010. These other components may include, for example, a camera 1050, an antenna 1060, a display 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated) or the like. However, these other components are not limited thereto, and may also include other components used for various purposes depending on type of the electronic device 1000 or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component or the like. However, the electronic device 1000 is not limited thereto, and may be any other electronic device processing data.

Figure 2:
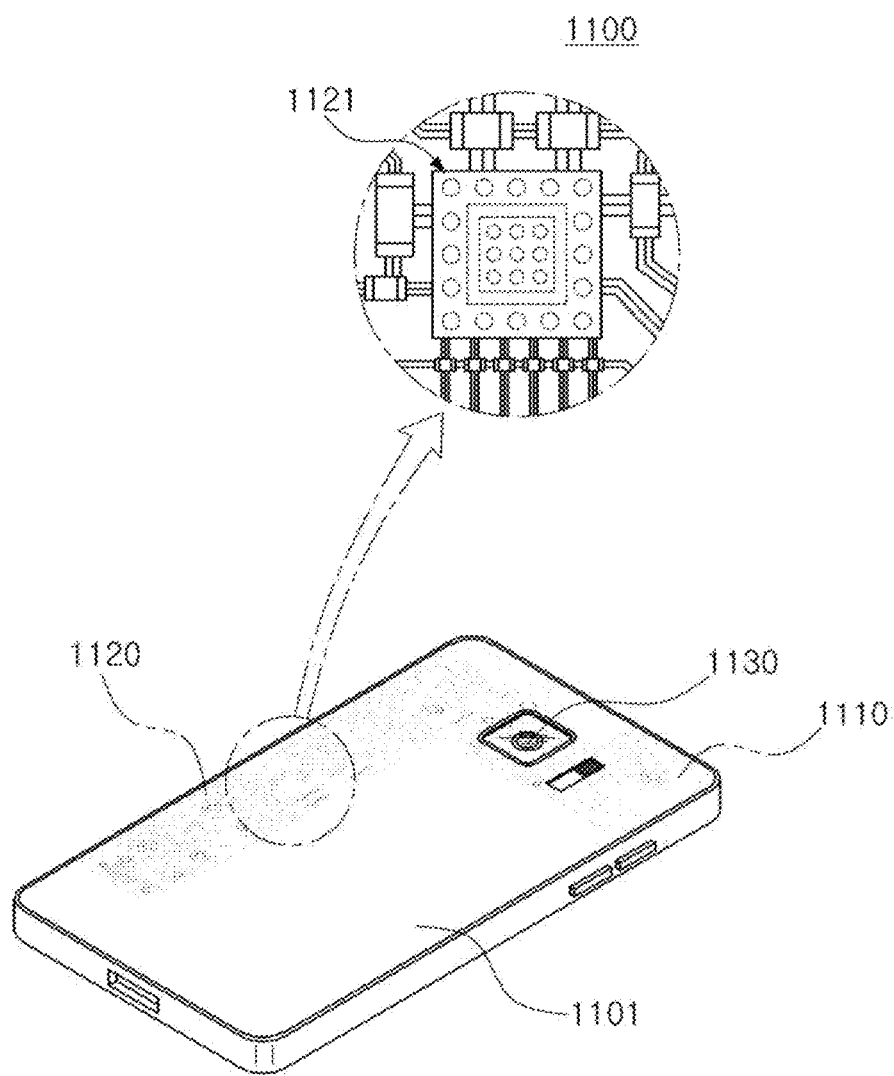
FIG. 2 is a schematic perspective view illustrating an example of an electronic device.

FIG. 2 is a schematic perspective view illustrating an example of an electronic device.

Referring to FIG. 2, a semiconductor package may be used for various purposes in the various electronic devices as described above. For example, a printed circuit board 1110 may be accommodated in a body 1101 of a smartphone 1100, and various electronic components 1120 may be physically and/or electrically connected to the printed circuit board 1110. In addition, other components that may or may not be physically and/or electrically connected to the printed circuit board 1110, such as a camera module 1130, may be accommodated in the body 1101. A portion of the electronic components 1120 may be the chip-related components, for example, a semiconductor package 1121, and are not limited thereto. The electronic device is not necessarily limited to the smartphone 1100, and may be one of other electronic devices as described above.

Semiconductor Package

In general, numerous fine electrical circuits are integrated in a semiconductor chip. However, the semiconductor chip may not serve as a finished semiconductor product in oneself, and may be damaged due to external physical or chemical impact. Therefore, the semiconductor chip is not used in oneself, but is packaged and used in an electronic device or the like, in a packaged state.

The reason why semiconductor packaging is required is that there is a difference in a circuit width between the semiconductor chip and a mainboard of the electronic device in terms of electrical connection. In detail, a size of connection pad of the semiconductor chip and an interval between the connection pads of the semiconductor chip are very fine, but a size of a component mounting pad of the mainboard and an interval between the component mounting pads of the mainboard used in the electronic device are significantly larger than those of the semiconductor chip. Therefore, it is difficult to directly mount the semiconductor chip on the mainboard, and thus required is packaging technology for buffering such a difference in a circuit width between the semiconductor and the mainboard.

A semiconductor package manufactured by this packaging technology may be classified as a fan-in semiconductor package or a fan-out semiconductor package depending on structure and purpose thereof.

Hereinafter, the fan-in semiconductor package and the fan-out semiconductor package are described in more detail with reference to the drawings.

Fan-in Semiconductor Package

Figure 3B:
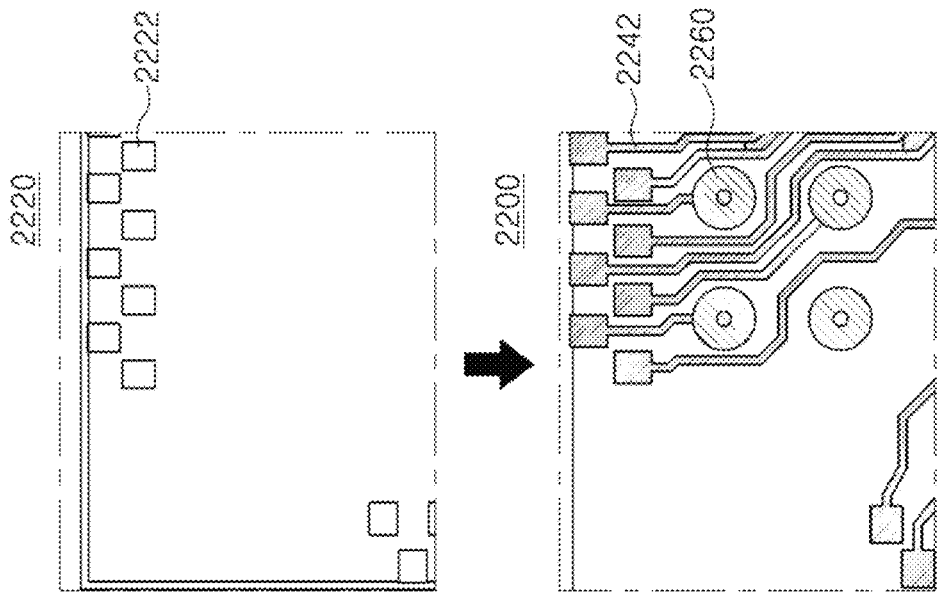
FIGS. 3A and 3B are schematic cross-sectional views illustrating states of a fan-in semiconductor package before and after being packaged.
Figure 3A:
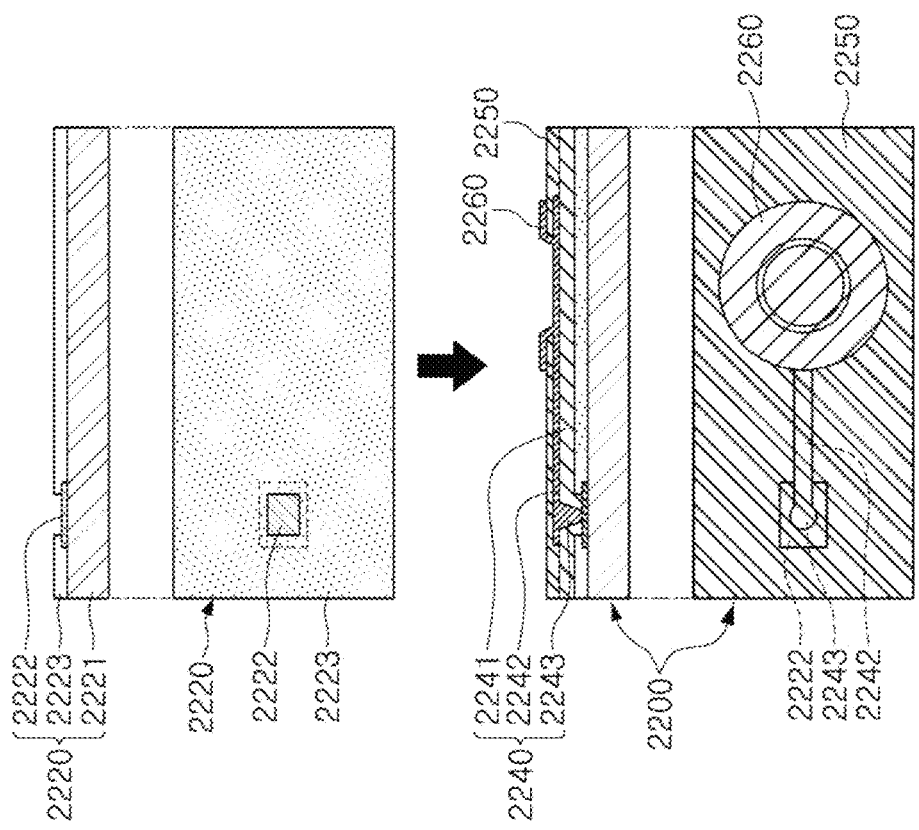
Figure 4:
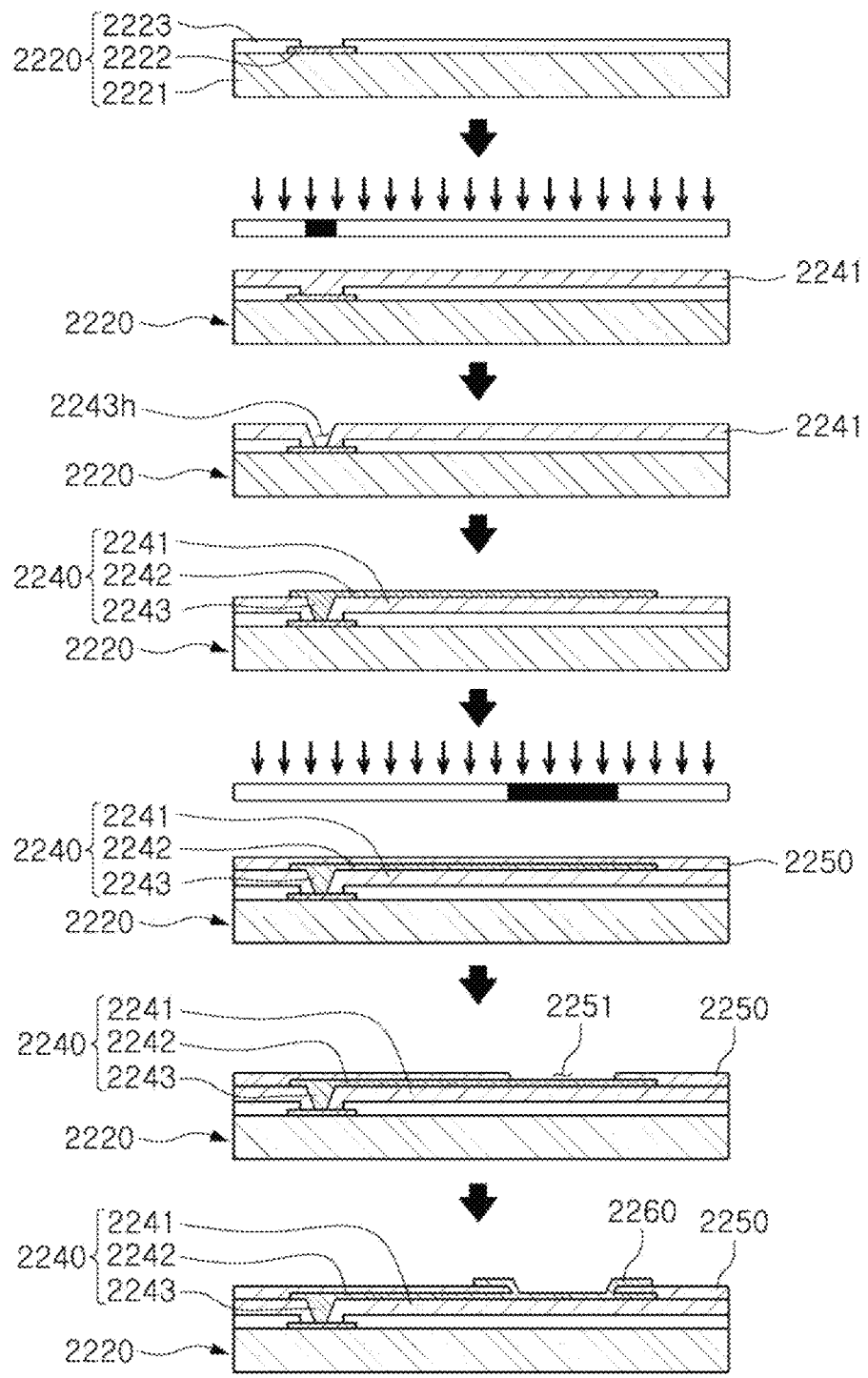
FIG. 4 shows schematic cross-sectional views illustrating a packaging process of a fan-in semiconductor package.

FIGS. 3A and 3B are schematic cross-sectional views illustrating states of a fan-in semiconductor package before and after being packaged, and FIG. 4 shows schematic cross-sectional views illustrating a packaging process of a fan-in semiconductor package.

Referring to FIGS. 3A through 4, a semiconductor chip 2220 may be, for example, an integrated circuit (IC) in a bare state, including a body 2221 including silicon (Si), germanium (Ge), gallium arsenide (GaAs) or the like, a connection pad 2222 formed on one surface of the body 2221 and formed of a conductive material such as aluminum (Al) or the like, and a passivation layer 2223 such as an oxide film, a nitride film or the like, formed on one surface of the body 2221 and covering at least a portion of the connection pad 2222. In this case, since the connection pad 2222 may be significantly small, it may be difficult to mount the integrated circuit (IC) on an intermediate level printed circuit board (PCB) as well as on the mainboard of the electronic device or the like.

Therefore, a connection structure 2240 may be formed depending on size of the semiconductor chip 2220 on the semiconductor chip 2220 in order to redistribute the connection pad 2222. The connection structure 2240 may be formed by forming an insulating layer 2241 on the semiconductor chip 2220 using an insulating material such as a photoimagable dielectric (PID) material, forming a via hole 2243h opening the connection pad 2222, and then forming a wiring pattern 2242 and a via 2243. Thereafter, there may be formed a passivation layer 2250 protecting the connection structure 2240, an opening 2251, and then an under-bump metal layer 2260 or the like. That is, a fan-in semiconductor package 2200 including, for example, the semiconductor chip 2220, the connection structure 2240, the passivation layer 2250, and the underbump metal layer 2260 may be manufactured through a series of processes.

As described above, the fan-in semiconductor package may have a package form in which all of the connection pads, for example, input/output (I/O) terminals of the semiconductor chip are disposed inside the semiconductor chip, and may have excellent electrical characteristics and be produced at a low cost. Therefore, many elements mounted in smartphones have been manufactured in a fan-in semiconductor package form. In detail, many elements mounted in smartphones have been developed to each implement a rapid signal transmission while having a small size.

However, since all I/O terminals need to be disposed inside the semiconductor chip in the fan-in semiconductor package, the fan-in semiconductor package has significant spatial limitations. Therefore, it is difficult to apply this structure to a semiconductor chip having a large number of I/O terminals or a semiconductor chip having a small size. In addition, due to the disadvantage described above, the fan-in semiconductor package may not be directly mounted and used on the mainboard of the electronic device. The reason is that even in a case in which a size of the I/O terminals of the semiconductor chip and an interval between the I/O terminals of the semiconductor chip are increased by a redistribution process, the size of the I/O terminals of the semiconductor chip and the interval between the I/O terminals of the semiconductor chip may not be sufficient to directly mount the fan-in semiconductor package on the mainboard of the electronic device.

Figure 5:
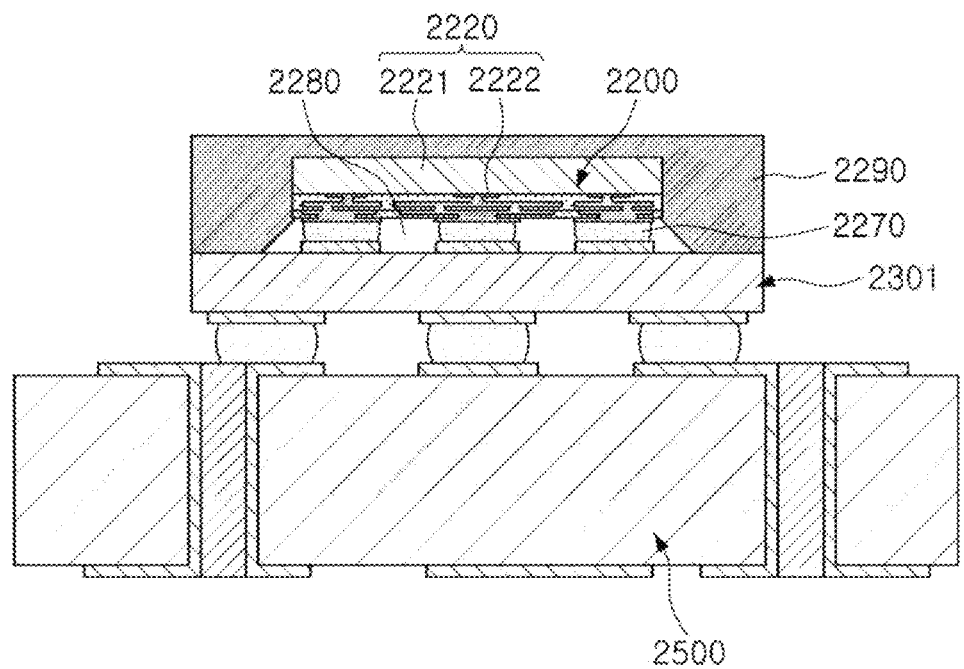
FIG. 5 is a schematic cross-sectional view illustrating a case in which a fan-in semiconductor package is mounted on an interposer substrate and is ultimately mounted on a mainboard of an electronic device.
Figure 6:
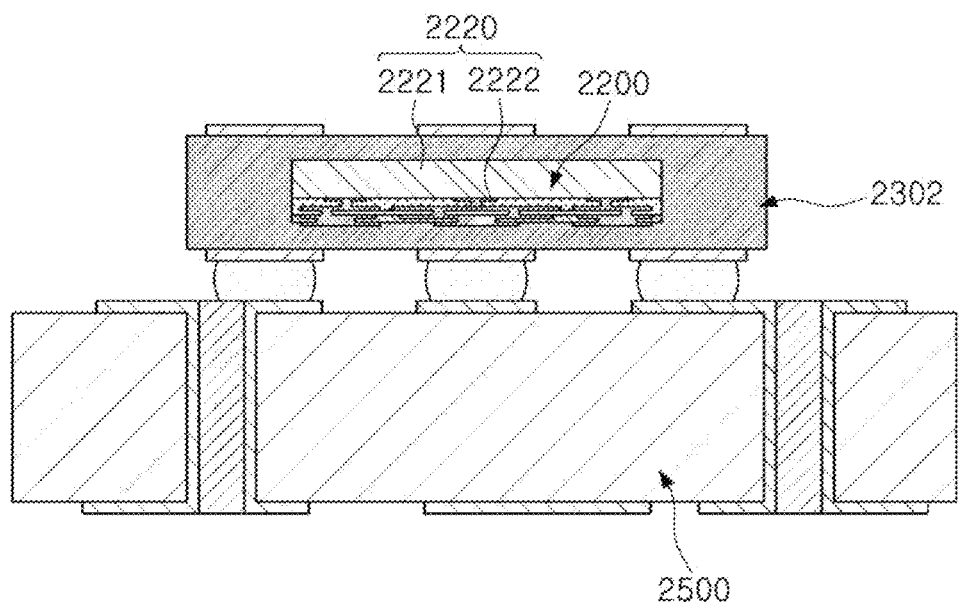
FIG. 6 is a schematic cross-sectional view illustrating a case in which a fan-in semiconductor package is embedded in an interposer substrate and is ultimately mounted on a mainboard of an electronic device.

FIG. 5 is a schematic cross-sectional view illustrating a case in which a fan-in semiconductor package is mounted on an interposer substrate and is ultimately mounted on a mainboard of an electronic device, and FIG. 6 is a schematic cross-sectional view illustrating a case in which a fan-in semiconductor package is embedded in an interposer substrate and is ultimately mounted on a mainboard of an electronic device.

Referring to FIGS. 5 and 6, in a fan-in semiconductor package 2200, connection pads 2222, that is, I/O terminals, of a semiconductor chip 2220 may be redistributed once more through an interposer substrate 2301, and the fan-in semiconductor package 2200 may be mounted on an interposer substrate 2301. In this manner, the fan-in semiconductor package 2200 may be ultimately mounted on a mainboard 2500 of an electronic device. In this case, a solder ball 2270 and the like may be fixed by an underfill resin 2280 or the like, and an outer side of the semiconductor chip 2220 may be covered with a molding material 2290 or the like. Alternatively, the fan-in semiconductor package 2200 may be embedded in a separate interposer substrate 2302. In a state in which the fan-in semiconductor package 2200 is embedded in the separate interposer substrate 2302, the connection pads 2222, that is, I/O terminals, of the semiconductor chip 2220 may be redistributed once more by the interposer substrate 2302. In this manner, the fan-in semiconductor package 2200 may be ultimately mounted on the mainboard 2500 of the electronic device.

As described above, it may be difficult to directly mount and use the fan-in semiconductor package on the mainboard of the electronic device. Therefore, the fan-in semiconductor package may be mounted on the separate interposer substrate and be then mounted on the mainboard of the electronic device through a packaging process or may be mounted and used on the mainboard of the electronic device in a state in which the fan-in semiconductor package is embedded in the interposer substrate.

Fan-Out Semiconductor Package

Figure 7:
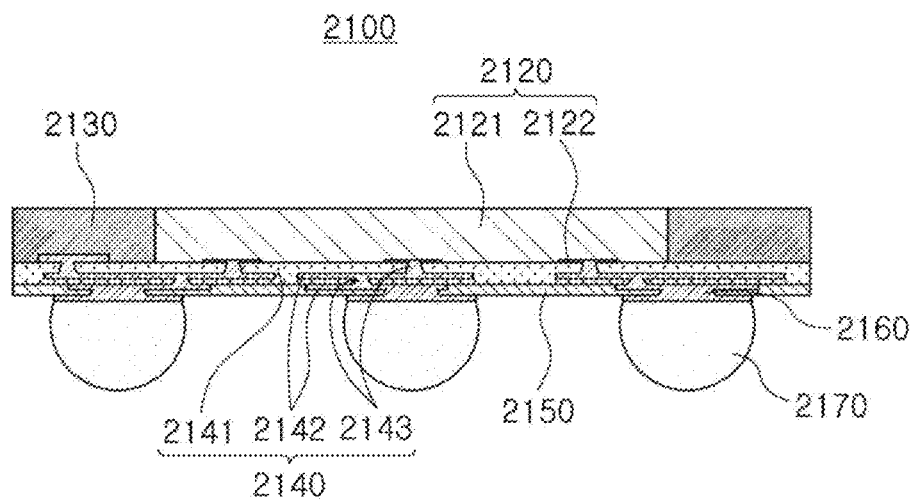
FIG. 7 is a schematic cross-sectional view illustrating a fan-out semiconductor package.

FIG. 7 is a schematic cross-sectional view illustrating a fan-out semiconductor package.

Referring to FIG. 7, in a fan-out semiconductor package 2100, for example, an outer side of a semiconductor chip 2120 may be protected by an encapsulant 2130, and a connection pad 2122 of the semiconductor chip 2120 may be redistributed outwardly of the semiconductor chip 2120 by a connection structure 2140. In this case, a passivation layer 2150 may further be formed on the connection structure 2140, and an underbump metal layer 2160 may further be formed in openings of the passivation layer 2150. A solder ball 2170 may further be formed on an underbump metal layer 2160. The semiconductor chip 2120 may be an integrated circuit (IC) including a body 2121, the connection pad 2122, a passivation layer (not illustrated) and the like. The connection structure 2140 may include an insulating layer 2141, a redistribution layer 2142 formed on the insulating layer 2141, and a via 2143 electrically connecting the connection pad 2122 and the redistribution layer 2142 to each other.

As described above, the fan-out semiconductor package may have a form in which I/O terminals of the semiconductor chip are redistributed and disposed outwardly of the semiconductor chip through the connection structure formed on the semiconductor chip. As described above, in the fan-in semiconductor package, all I/O terminals of the semiconductor chip need to be disposed inside the semiconductor chip. Therefore, when a size of the semiconductor chip is decreased, a size and a pitch of balls need to be decreased, such that a standardized ball layout may not be used in the fan-in semiconductor package. Whereas, the fan-out semiconductor package has the form in which the I/O terminals of the semiconductor chip are redistributed and disposed outwardly of the semiconductor chip through the connection structure formed on the semiconductor chip as described above. Therefore, even in the case in which a size of the semiconductor chip is decreased, the standardized ball layout may be used in the fan-out semiconductor package as it is, such that the fan-out semiconductor package may be mounted on the mainboard of the electronic device without using a separate printed circuit board, as described below.

Figure 8:
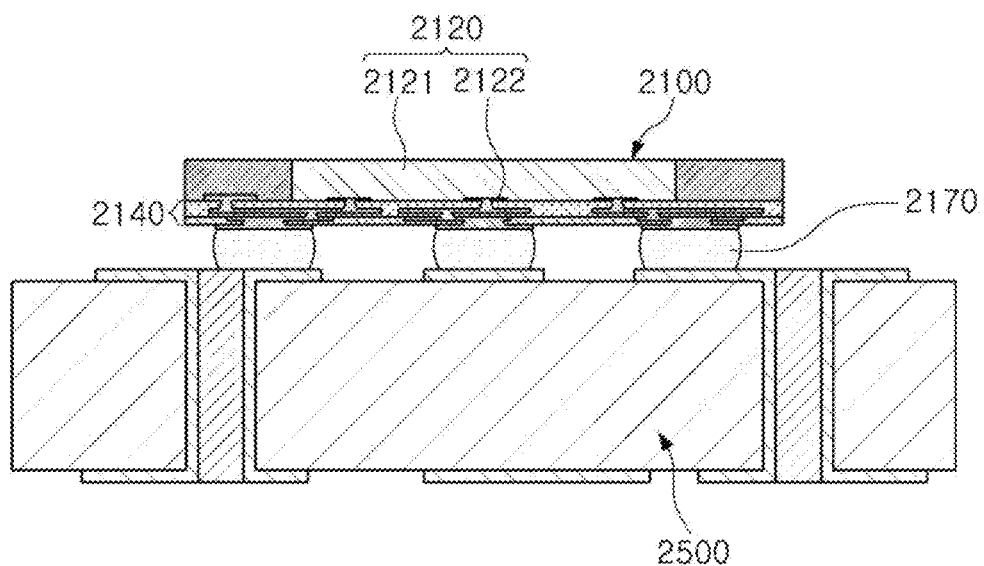
FIG. 8 is a schematic cross-sectional view illustrating a case in which a fan-out semiconductor package is mounted on a mainboard of an electronic device.

FIG. 8 is a schematic cross-sectional view illustrating a case in which a fan-out semiconductor package is mounted on a mainboard of an electronic device.

Referring to FIG. 8, a fan-out semiconductor package 2100 may be mounted on a mainboard 2500 of an electronic device by solder balls 2170 or the like. That is, as described above, the fan-out semiconductor package 2100 includes a connection structure 2140 formed on a semiconductor chip 2120 and capable of redistributing a connection pad 2122 to a fan-out region beyond a size of the semiconductor chip 2120, such that the standardized ball layout may be used in the fan-out semiconductor package 2100 as it is. As a result, the fan-out semiconductor package 2100 may be mounted on the mainboard 2500 of the electronic device without using a separate interposer substrate or the like.

As described above, since the fan-out semiconductor package may be mounted on the mainboard of the electronic device without using the separate interposer substrate, the fan-out semiconductor package may be implemented at a thickness lower than that of the fan-in semiconductor package using the interposer substrate. Therefore, the fan-out semiconductor package may be miniaturized and thinned. In addition, the fan-out semiconductor package has excellent thermal characteristics and electrical characteristics, and thus is particularly appropriate for a mobile product. In addition, the fan-out semiconductor package may be implemented in a form more compact than that of a general package-on-package (POP) type using a printed circuit board (PCB), and may solve a problem due to occurrence of a warpage phenomenon.

Meanwhile, the fan-out semiconductor package refers to package technology for mounting the semiconductor chip on the mainboard of the electronic device or the like, as described above, and protecting the semiconductor chip from external impacts, and thus is a concept different from that of a printed circuit board (PCB) such as an interposer substrate or the like, having a scale, a purpose and the like, different from those of the fan-out semiconductor package, and having the fan-in semiconductor package embedded therein.

Hereinafter, a type of a semiconductor package having a structure in which a plurality of semiconductor chips may be packaged to have optimal signal and power characteristics is described with reference to the accompanying drawings.

Figure 9:
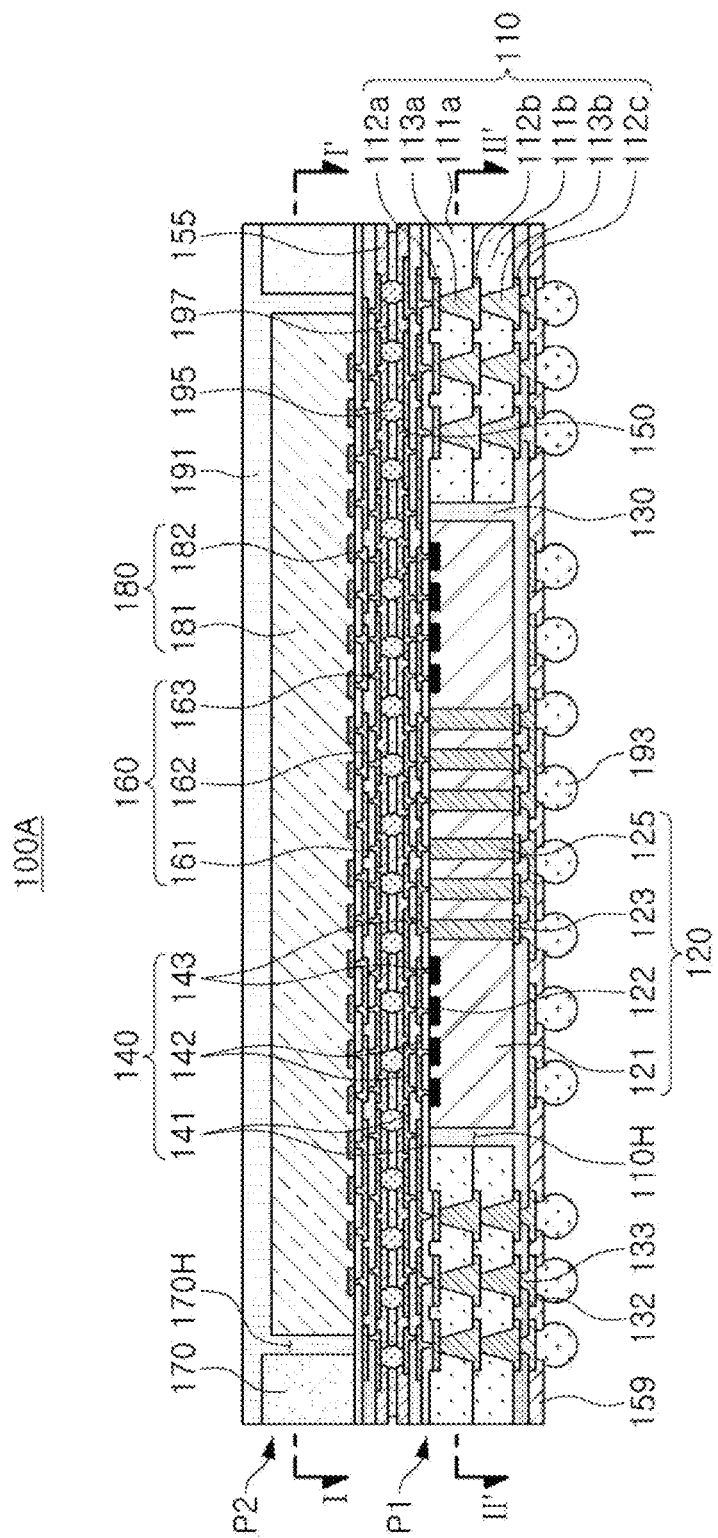
FIG. 9 is a schematic cross-sectional view illustrating an example of a semiconductor package.
Figure 10A:
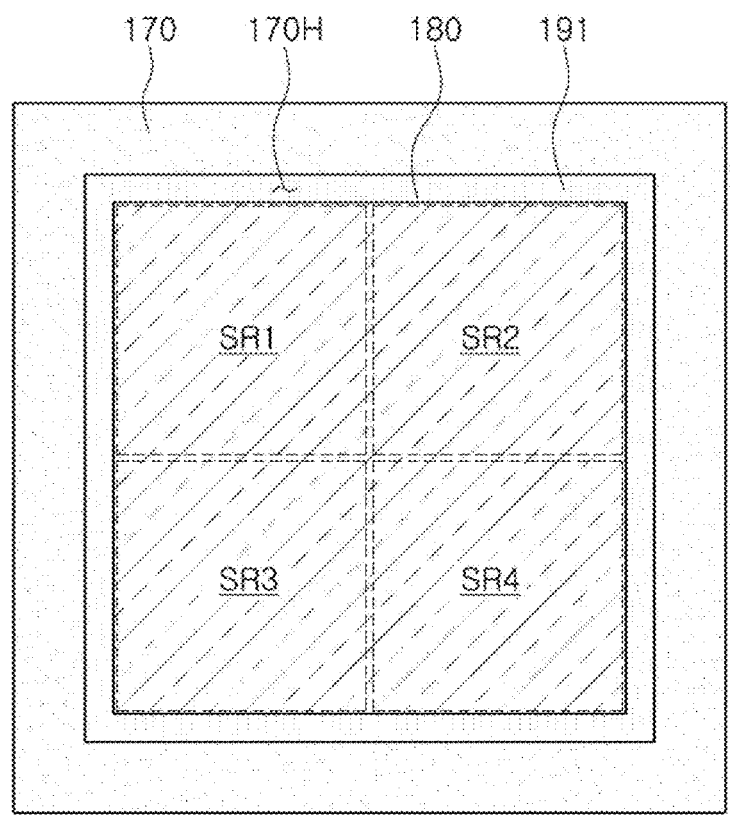
FIGS. 10A and 10B are schematic plan views taken along line I-I' and II-II' of the fan-out semiconductor package of FIG. 9.
Figure 10B:
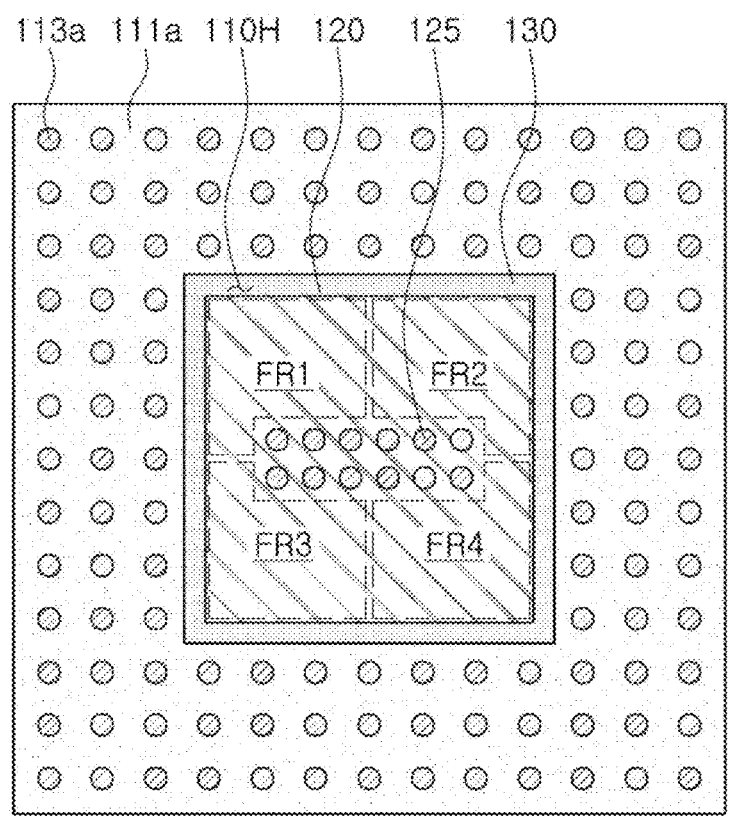

FIG. 9 is a schematic cross-sectional view illustrating an example of a semiconductor package, and FIGS. 10A and 10B are schematic plan views taken along line I-I' and II-II' of the fan-out semiconductor package of FIG. 9.

Referring to FIGS. 9 through 10B, a semiconductor package 100A has a package-on-package (POP) structure including a first semiconductor package P1 and a second semiconductor package P2 stacked in a vertical direction, in which the second semiconductor package P2 is stacked on the first semiconductor package P1. The first semiconductor package P1 may include: a first frame 110 having a first through portion 110H, a first semiconductor chip 120 disposed in the first through portion 110H of the first frame 110 and having a first connection pad 122 disposed on a first surface and a second connection pad 123 disposed on a second surface opposing the first surface, a first encapsulant 130 encapsulating at least portions of the first frame 110 and the first semiconductor chip 120, a first connection structure 140 disposed on the first frame 110 and the first surface of the first semiconductor chip 120 and including a first redistribution layer 142, a backside redistribution layer 132 disposed on a lower surface of the first encapsulant 130, first and second passivation layers 150 and 159 respectively disposed on an upper surface of the first connection structure 140 and a lower surface of the backside redistribution layer 132, and a plurality of electrical connection metals 193 respectively disposed in a plurality of openings of the second passivation layer 159. The second semiconductor package P2 may include: a second connection structure 160 including a second redistribution layer 162, a second frame 170 disposed on the second connection structure 160 and having a second through portion 170H, a second semiconductor chip 180 disposed in the second through portion 170H of the second frame 170 and having a third connection pad 182 disposed on an active surface of the second semiconductor chip 180, a second encapsulant 191 encapsulating at least portions of the second frame 170 and the second semiconductor chip 180, a third passivation layer 155 disposed on a lower surface of the second connection structure 160, a plurality of connection terminals 195 respectively disposed in a plurality of openings of the third passivation layer 155, and an underfill layer 197 filling each space between the plurality of connection terminals 195.

The first semiconductor chip 120 may include a body 121, the first and second connection pads 122 and 123, and a through via 125. An active surface of the first semiconductor chip 120 may be the first surface on which the first connection pad 122 is disposed, and an inactive surface of the first semiconductor chip 120 may be the second surface opposing the first surface and on which the second connection pad 123 is disposed. However, the first semiconductor chip is not limited thereto. In particular, the second connection pad 123 may be disposed in a protrusion form on the second surface of the first semiconductor chip 120, and is not limited thereto. The through via 125 may be connected to the second connection pad 123 and extend from the second connection pad 123 to the active surface or a region adjacent to the active surface of the first semiconductor chip 120 by penetrating through at least a portion of the first semiconductor chip 120. For example, the through via 125 may extend to penetrate through the entire first semiconductor chip 120, or extend from the second connection pad 123 to penetrate through at least a portion of an active layer which is disposed in contact with the active surface of the first semiconductor chip 120 and on which a semiconductor element is disposed. The through vias 125 may be electrically connected to the semiconductor elements inside the first semiconductor chip 120.

In the first semiconductor chip 120, the first connection pad 122 may be electrically connected to the first redistribution layer 142 on the first semiconductor chip 120. The through via 125 may be electrically connected to a backside redistribution layer 132 below the first semiconductor chip 120 through the second connection pad 123. The first connection pad 122 may be particularly connected to a signal pattern of the first redistribution layer 142, and the second connection pad 123 and the through via 125 may be connected to the power pattern and/or the ground pattern of the backside redistribution layer 132. That is, in the first semiconductor chip 120, a signal such as a data signal may be transmitted and received through the first connection pad 122, and power may be supplied through the through via 125. On a plane, the second connection pad 123 and the through via 125 may be disposed in a central region of the first semiconductor chip 120, and the first connection pad 122 may be disposed in an edge region surrounding the central region of the first semiconductor chip 120. However, the first semiconductor chip 120 is not limited thereto.

Meanwhile, a functional partitioning method of the AP has recently been used for advanced performance of an application processor (AP), a key component of a smart electronic device. For example, when partitioning a semiconductor chip die of the AP for each function, and then designing and packaging each semiconductor chip to be optimized for process and feature thereof, the AP may implement a performance more advanced than a conventional single AP.

Accordingly, in the semiconductor package 100A according to an embodiment, the first semiconductor chip 120 and the second semiconductor chip 180, which may perform different functions, may be disposed so that the first connection pad 122 and the third connection pad 182 face each other with the first and second connection structures 140 and 160 interposed therebetween. The first semiconductor chip 120 may be disposed below the first connection structure 140 so that the active surface of the first semiconductor chip 120, on which the first connection pad 122 is disposed, faces a lower surface of the first connection structure 140. The second semiconductor chip 180 may be disposed on an upper surface of the second connection structure 160 so that the active surface of the second semiconductor chip 180, on which the third connection pad 182 is disposed, faces the upper surface of the second connection structure 160. On the plane, the second semiconductor chip 180 may be disposed so that at least a portion of the second semiconductor chip 180 overlaps the first semiconductor chip 120 in a vertical direction. Each of the first and second semiconductor chips 120 and 180 may be a chip having a partitioned function of the application processor AP. That is, the first and second semiconductor chips 120 and 180 may each implement a partial or entire function of the application processor, and are not limited thereto.

In particular, as illustrated in FIGS. 10A and 10B, the first and second semiconductor chips 120 and 180 may have a plurality of first regions FR1, FR2, FR3 and FR4, and a plurality of second regions SR1, SR2, SR3 and SR4; and these two regions perform different functions, respectively. A via region in which the through vias 125 are arranged may be further disposed between the plurality of first regions FR1, FR2, FR3 and FR4 of the first semiconductor chip 120. In the plurality of second regions SR1, SR2, SR3 and SR4 of the second semiconductor chip 180, a relatively higher function may be performed than in the plurality of first regions FR1, FR2, FR3 and FR4 of the first semiconductor chip 120. For example, the plurality of first regions FR1, FR2, FR3 and FR4 of the first semiconductor chip 120 may be logic regions in which an arithmetic function of the application processor is performed, and the plurality of second regions SR1, SR2, SR3 and SR4 of the second semiconductor chip 180 may be regions in which a power related function of the application processor is performed. Alternatively, in another embodiment, the second semiconductor chip 180 may be an application processor (AP) chip, the first semiconductor chip 120 may be a power management integrated circuit (PMIC) chip, in which the plurality of first regions FR1, FR2, FR3 and FR4 and the plurality of second regions SR1, SR2, SR3 and SR4 may perform corresponding functions, respectively.

In addition, second semiconductor elements arranged in the plurality of the second regions SR1, SR2, SR3 and SR4 of the second semiconductor chip 180 may have relatively smaller scale than first semiconductor elements arranged in the plurality of first regions FR1, FR2, FR3 and FR4 of the first semiconductor chip 120. The scale of the semiconductor element may refer to a feature size, specifically to a numerical value expressed as a critical dimension. The critical dimension may refer to, for example, a minimum length of a transistor channel and/or a minimum length of a gate electrode when the semiconductor element is the transistor. Thus, the first semiconductor element may have a first critical dimension, and the second semiconductor element may have a second critical dimension, smaller than the first critical dimension. For example, the first critical dimension may range from 0.05 mm to 10 mm, and the second critical dimension may range from 1 nm to 100 nm. As such, the first and second semiconductor chips 120 and 180 having different specifications may be partitioned into the different semiconductor packages P1 and P2 and then stacked vertically; and thus, it is possible to optimize and streamline each manufacturing process of the semiconductor chip and the semiconductor package, thereby reducing manufacturing costs.

In this case, a portion of the first connection pads 122 of the first semiconductor chip 120 may be electrically connected to a portion of the third connection pads 182 through signal patterns in a region in which the first semiconductor chip 120 and the second semiconductor chip 180 overlap each other in a vertical direction. Accordingly, signals may be connected between the first semiconductor chip 120 and the second semiconductor chip 180 in the vertical direction. In addition, at least a portion of the second connection pads 123 of the first semiconductor chip 120 may be electrically connected to the power patterns and/or the ground patterns of the backside redistribution layers 132 disposed below the first semiconductor chip 120; may be electrically connected to the power patterns and/or the ground patterns of the first redistribution layers 142 of the first connection structure 140 on the first semiconductor chip 120 through the through vias 125; and may be electrically connected to a portion of the third connection pads 182. Therefore, the first and second semiconductor chips 120 and 180 may be connected to each other at the shortest distance, thereby optimizing a signal feature; and the first and second semiconductor chips 120 and 180 may be connected to the electrical connection metal 193 at the shortest distance by the through via 125, thereby also optimizing power characteristics.

Hereinafter, the respective components included in the semiconductor package 100A according to an embodiment are described below in more detail.

The first frame 110 may have the first through portion 110H having a form of a through-hole and the first semiconductor chip 120 may be disposed in the first through portion 110H so that a surface on which the first connection pad 122 is disposed faces the lower surface of the first connection structure 140. The first frame 110 may serve as a support member. Here, the first connection pad 122 may be connected to the first connection via 143 of the first connection structure 140 without using a separate bump. In addition, the first frame 110 may include: a first insulating layer 111a in contact with the lower surface of the first connection structure 140.

The first wiring layer 112a may be recessed into the first insulating layer 111a. That is, the surface of the first insulating layer 111a, which is in contact with the lower surface of the first connection structure 140, may have a step difference from the surface of the first wiring layer 112a, which is in contact with the lower surface of the first connection structure 140. In this case, when the first semiconductor chip 120 and the first frame 110 are encapsulated by the first encapsulant 130, it is possible to prevent encapsulant material from bleeding to contaminate the first wiring layer 112a. Each thickness of the first to third wiring layers 112a, 112b and 112c may be greater than that of the first redistribution layer 142.

When forming a hole to form the first wiring via layer 113a, a partial pad of the first wiring layer 112a may serve as a stopper, and it may thus be advantageous in a process that each connection via of the first wiring via layer 113a has a tapered shape in which a width of an upper surface is smaller than that of a lower surface. In this case, a wiring via of the first wiring via layer 113a may be integrated with a pattern of the second wiring layer 112b. Likewise, when forming a hole to form the second wiring via layer 113b, a partial pad of the second wiring layer 112b may serve as a stopper, and it may thus be advantageous in a process that the wiring via of the second via layer 113b has a tapered shape in which a width of an upper surface is smaller than the width of a lower surface. In this case, the wiring via of the second via layer 113b may be integrated with a pad pattern of the third wiring layer 112c.

The first and second insulating layers 111a and 111b may be formed of an insulating material. Here, the insulating material may be a thermosetting resin such as an epoxy resin, a thermoplastic resin such as a polyimide resin, or an insulating material in which the thermosetting resin or the thermoplastic resin is impregnated in an inorganic filler and/or a core material such as a glass fiber (or a glass cloth or a glass fabric), for example, prepreg, Ajinomoto Build up Film (ABF), Frankel's function regulator-4 (FR-4), Bismaleimide Triazine (BT) or the like.

The first to third wiring layers 112a, 112b and 112c may serve to redistribute the first connection pads 122 of the first semiconductor chip 120, and thus to provide pad patterns to the wiring via layers 113a and 113b for connecting an upper portion and a lower portion of the package 100A to each other. The first to third wiring layers 112a, 112b and 112c may be formed of a metallic material such as copper (Cu), aluminum (Al), silver (Ag), tin (Sn), gold (Au), nickel (Ni), lead (Pb), titanium (Ti) or alloys thereof. The first to third wiring layers 112a, 112b and 112c may perform various functions depending on a design of corresponding layers. For example, the first to third wiring layers 112a, 112b and 112c may each include a ground (GND) pattern, a power (PWR) pattern, a signal (S) pattern and the like. Here, the signal (S) pattern may be one of various signals, for example, a data signal and the like, except for the ground (GND) pattern and the power (PWR) pattern related to the power and the like.

The first and second wiring via layers 113a and 113b may electrically connect the first to third wiring layers 112a, 112b and 112c formed on different layers to each other, thereby forming an electrical connection path in the first frame 110. In addition, the first and second wiring via layers 113a and 113b may form an electrical connection path between the first connection structure 140 and the electrical connection metal 193. The first and second wiring via layers 113a and 113b may each be formed of the metallic material. The first and second wiring via layers 113a and 113b may each be a filled via entirely filled with the metallic material, or a conformal via having the metallic material formed along a wall of a via hole. In addition, the first and second wiring via layers 113a and 113b may each have a tapered shape. Meanwhile, the first and second wiring via layers 113a and 113b may be integrated with at least portions of the first to third wiring layers 112a, 112b and 112c, and are not limited thereto.

The second frame 170 may have the second through portion 170H having the form of a through-hole and the second semiconductor chip 180 may be disposed in the second through portion 170H so that a surface on which the third connection pad 182 is disposed faces an upper surface of the second connection structure 160. Here, the third connection pad 182 may be connected to the second connection via 163 of the second connection structure 160 without using a separate bump. Unlike the first frame 110, the second frame 170 may not include a wiring layer or a wiring via layer. However, the second frame 170 is not limited thereto.

The first and second semiconductor chips 120 and 180 may each be an integrated circuit (IC) in which several hundred to several million or more elements are integrated in a single chip. As a non-restrictive example, the first and second semiconductor chips 120 and 180 may be combined to form a single complete application processor (AP). In this case, each of the first and second semiconductor chips 120 and 180 may be a chip having a partitioned function of the application processor AP, for example, a central processor (CPU), a graphics processor (GPU), a field programmable gate array (FPGA), a digital signal processor, a cryptographic processor, a microprocessor, and/or a microcontroller or the like; or a partitioned chip having a different function not illustrated. However, the first and second semiconductor chips 120 and 180 are not limited thereto, and at least one of the first and second semiconductor chips 120 and 180 may be a volatile memory (a dynamic random access memory (DRAM)), a non-volatile memory (a read only memory (ROM)), a flash memory or the like. The first semiconductor chip 120 and the second semiconductor chip 180 may have different specifications such as functions and scales as described above, and the second semiconductor chip 180 may be a more advanced chip than the first semiconductor chip 120. Also, the second semiconductor chip 180 may have a larger size than the first semiconductor chip 120, and is not limited thereto.

The first and second semiconductor chips 120 and 180 may be formed on the basis of an active wafer; and in this case, a base material of the body 121 and that of a body 181 may be silicon (Si), germanium (Ge), gallium arsenide (GaAs) or the like. Various semiconductor elements and circuits may be formed on the bodies 121 and 181. The first to third connection pads 122, 123 and 182 and the through via 125 may electrically connect the first and second semiconductor chips 120 and 180 to other components. The first to third connection pads 122, 123 and 182 and the through via 125 may be formed of a conductive material such as aluminum (Al), copper (Cu) or the like without any particular limitation. A passivation film may be further formed on the bodies 121 and 181 to expose the first to third connection pads 122, 123 and 182; and in this case, the passivation film may be an oxide film, a nitride film or the like, or may be a double layer formed of the oxide film and the nitride film. The first and second semiconductor chips 120 and 180 may be bare dies; however, may be packaged dies in which separate redistribution layers are further formed on surfaces on which the first and third connection pad 122 and 182 are disposed, respectively, i.e. the active surfaces, when necessary.

The first and second encapsulants 130 and 191 may respectively protect the first and second frames 110 and 170, and the first and second semiconductor chips 120 and 180, and the like. There is no particular limitation on encapsulating manner of the first and second encapsulants 130 and 191. For example, the first encapsulant 130 may cover the first frame 110 and a surface on which the second connection pad 123 is disposed, and may fill at least a portion of the first through portion 110H. The second encapsulant 191 may cover the second frame 170 and an upper surface of the second semiconductor chip 180, opposing the surface of the second semiconductor chip 180 on which the third connection pad 182 is disposed and may fill at least a portion of the second through portion 170H. As the first and second encapsulants 130 and 191 may fill the first and second through portions 110H and 170H, it is possible to perform an adhesive function depending on specific material and also to reduce a buckling.

Materials of the first and second encapsulants 130 and 191 may not be particularly limited. For example, the materials of the first and second encapsulants 130 and 191 may be an insulating material; and in this case, the insulating material may be a thermosetting resin such as an epoxy resin, a thermoplastic resin such as a polyimide resin, a resin in which the thermosetting resin or the thermoplastic resin is mixed with an inorganic filler or is impregnated together with an inorganic filler in a core material such as a glass fiber (or a glass cloth or a glass fabric), for example, prepreg, Ajinomoto Build-up Film (ABF), Frankel's function regulator-4 (FR-4), Bismaleimide Triazine (BT) or the like. When necessary, a photoimagable encapsulant (PIE) resin may also be used.

The first connection structure 140 may redistribute the first connection pad 122 of the first semiconductor chip 120. In addition, the first connection structure 140 may electrically connect the first connection pads 122 to the wiring layers 112a, 112b and 112c of the first frame 110, respectively, depending on function. The second connection structure 160 may redistribute the third connection pad 182 of the second semiconductor chip 180. In addition, the first and second connection structures 140 and 160 may be electrically connected to each other and may electrically connect the first connection pad 122 to the third connection pad 182. Several tens to several millions of the first and third connection pads 122 and 182 having various functions may be redistributed through the first and second connection structures 140 and 160, and may be physically and/or electrically externally connected through the electrical connection metals 193 depending on function. The first and second connection structures 140 and 160 may include the insulating layers 141 and 161, first and second redistribution layers 142 and 162 disposed on the insulating layers 141 and 161, and first and second connection vias 143 and 163 penetrating through the insulating layers 141 and 161, respectively. The insulating layers 141 and 161 of the first and second connection structures 140 and 160, the first and second redistribution layers 142 and 162, and the first and second connection vias 143 and 163 may each be formed to have a greater or smaller number of layers than those illustrated in the drawings.

The insulating layers 141 and 161 may each be formed of an insulating material. Here, as the insulating material, a photosensitive insulating material such as a photoimagable dielectric (PID) resin may be used in addition to the insulating material as described above. That is, each of the insulating layers 141 and 161 may be a photosensitive insulating layer. When the insulating layers 141 and 161 have photosensitive properties, the insulating layers 141 and 161 may be formed to have a smaller thickness, and fine pitches of the first and second connection vias 143 and 163 may be achieved more easily. The insulating layers 141 and 161 may be photosensitive insulating layers formed of an insulating resin and an inorganic filler, respectively. When the insulating layers 141 and 161 each has a multilayer structure, materials of the insulating layers 141 and 161 may be the same as each other, or may be different from each other when necessary. When the insulating layers 141 and 161 each has the multilayer structure, the insulating layers 141 may be integrated with each other depending on process, such that a boundary therebetween may not be apparent, and the insulating layers 161 may be integrated with each other depending on process, such that a boundary therebetween may not be apparent. However, the insulation layers 141 and 161 are not limited thereto.

The first and second redistribution layers 142 and 162 may substantially redistribute the first and third connection pads 122 and 182, and may provide the electrical connection path as described above. The redistribution layers 142 and 162 may each be formed of a metallic material such as copper (Cu), aluminum (Al), silver (Ag), tin (Sn), gold (Au), nickel (Ni), lead (Pb), titanium (Ti) or alloys thereof. The first and second redistribution layers 142 and 162 may each perform various functions depending on design of a corresponding layer. For example, each of the redistribution layers 142 and 162 may include a ground pattern, a power pattern, a signal pattern and the like. The signal pattern may be one of various signals, for example, a data signal and the like, except for the ground pattern, the power pattern and the like. Here, the pattern is a concept including a wiring and a pad. The first and second redistribution layers 142 and 162 may mainly include the power and/or ground patterns in a region in which the first and second redistribution layers 142 and 162 overlap the through vias 125 of the first semiconductor chip 120. The first and second redistribution layers 142 and 162 may mainly include the signal patterns in the region in which the first semiconductor chip 120 and the second semiconductor chip 180 overlap each other in vicinities of the through vias 125.

The first connection vias 143 may be connected to the first redistribution layer 142, the first connection pad 122, the through via 125 and the uppermost first wiring layer 112a, respectively, and thus may connect the first redistribution layer 142, the first connection pad 122, the through via 125, the wiring layers 112a, 112b and 112c and the like, which are respectively formed on different layers, to each other. As a result, the first connection via 143 may form an electrical connection path in the first connection structure 140. The second connection vias 163 may electrically connect the second redistribution layer 162, the third connection pad 182 and the like, which are formed on different layers, to each other. As a result, the second via 163 may form an electrical connection path in the second connection structure 160. The first and second connection vias 143 and 163 may each be formed of the metallic material such as copper (Cu), aluminum (Al), silver (Ag), tin (Sn), gold (Au), nickel (Ni), lead (Pb), titanium (Ti) or alloys thereof. The first and second connection vias 143 and 163 may each be a filled via filled with the metallic material or a conformal via having the metallic material formed along a wall of a via hole. The first and second connection vias 143 and 163 may each have a tapered cross-sectional shape. The first and second connection vias 143 and 163 may have taper directions opposite to each other and the first connection via 143 may have the taper direction opposite to the taper direction of the wiring via layers 113a and 113b of the first frame 110.

The backside redistribution layer 132 and a backside connection via 133 may be disposed below the first encapsulant 130. The backside connection via 133 may penetrate through at least a portion of the first encapsulant 130, thereby electrically connecting the third wiring layer 112c and the backside redistribution layer 132 to each other.

The backside redistribution layers 132 may also serve to redistribute the first to third connection pads 122, 123 and 182, and thus to provide the above-described electrical connection paths. The backside redistribution layer 132 may be formed of a metallic material such as copper (Cu), aluminum (Al), silver (Ag), tin (Sn), gold (Au), nickel (Ni), lead (Pb), titanium (Ti) or alloys thereof. The backside redistribution layer 132 may perform various functions depending on design of a corresponding layer. For example, the backside redistribution layer 132 may include a ground pattern, a power pattern, a signal pattern and the like. The ground pattern and the signal pattern may be the same pattern. The signal pattern may be one of various signals, for example, a data signal and the like, except for the ground pattern, the power pattern and the like. Here, the pattern is a concept including a wiring and a pad.

The backside connection via 133 may electrically connect the third wiring layer 112c and the backside redistribution layer 132 to each other. The backside connection via 133 may also be formed of the metallic material such as copper (Cu), aluminum (Al), silver (Ag), tin (Sn), gold (Au), nickel (Ni), lead (Pb), titanium (Ti) or alloys thereof. The backside connection via 133 may be a filled via filled with the metallic material or a conformal via having the metallic material formed along a wall of a via hole. The backside connection via 133 may have a tapered cross-sectional shape. The backside connection via 133 may have the same taper direction as each wiring via of the first and second wiring via layers 113a and 113b. Numbers of the backside redistribution layers 132 and the backside via 133 may be varied in another embodiment.

The first and second passivation layers 150 and 159 may be additionally used to protect the first connection structure 140 and the backside redistribution layer 132, respectively, from external physical or chemical damage or the like. The third passivation layer 155 may be additionally used to protect the second connection structure 160 from external physical or chemical damage. The first to third passivation layers 150, 155 and 159 may include a thermosetting resin. For example, the passivation layers 150, 155 and 159 may be formed of ABF, but are not limited thereto. The first to third passivation layers 150, 155 and 159 may have a plurality of openings exposing at least portions of the first and second redistribution layers 142 and 162 and the backside redistribution layer 132, respectively. The openings may be provided in an amount of several tens to several tens of thousands, and more or less. Each opening may include a plurality of holes.

The electrical connection metal 193 may be additionally used to physically and/or electrically externally connect the semiconductor package 100A. For example, the semiconductor package 100A may be mounted on the mainboard of the electronic device by the electrical connection metal 193. The electrical connection metals 193 may be disposed on the plurality of openings of the second passivation layer 159, respectively. Accordingly, the electrical connection metal 193 may be electrically connected to the exposed backside redistribution layer 132. When necessary, underbump metals may be formed in a plurality of openings of the second passivation layer 159; and in this case, the underbump metals may be electrically connected to the exposed backside redistribution layers 132. The electrical connection metal 193 may be formed of a low melting point metal such as tin (Sn) or an alloy including tin (Sn). In more detail, the electrical connection metal 193 may be a solder or the like; however, this material is only an example, and a material of the electrical connection metal 193 is not particularly limited thereto.

The electrical connection metal 193 may have a shape of a land, a ball, a pin or the like. The electrical connection metal 193 may be formed as a multilayer or a single layer. When formed as the multilayer, the electrical connection metal 193 may include a copper (Cu) pillar and a solder; and when formed as the single layer, the electrical connection metal 193 may include a tin-silver solder or copper (Cu). However, this material is only an example, and a material of the electrical connection metal 193 is not limited thereto. The number, an interval, a disposition form and the like of the electrical connection metals 193 are not particularly limited, and may be sufficiently modified depending on design particulars by those skilled in the art. For example, the electrical connection metal 193 may be provided in an amount of several tens to several tens of thousands, and more or less depending on the number of the first to third connection pads 122, 123 and 182.

At least one of the electrical connection metals 193 may be disposed in a fan-out region. The fan-out region refers to a region except for a region in which the first semiconductor chip 120 is disposed. That is, the semiconductor package 100A according to an embodiment may be a fan-out semiconductor package. The fan-out package may have higher reliability than a fan-in package, may implement a plurality of input/output (I/O) terminals, and may facilitate a 3 dimensional (3D) interconnection. In addition, when compared with a ball grid array (BGA) package, a land grid array (LGA) package or the like, the fan-out package may be manufactured to have a smaller thickness, and may have price competitiveness.

The connection terminals 195 may be disposed between the first and second connection structures 140 and 160 to electrically and physically connect the first and second redistribution layers 142 and 162 to each other. The connection terminal 195 may be formed of copper (Cu), tin (Sn) or an alloy thereof, and for example, may be formed of a low melting point metal such as a solder. The number and a shape of the connection terminal 195 may be varied in another embodiment.

The underfill layer 197 may be disposed between the first and second connection structures 140 and 160 to cover at least portions of the connection terminals 195. The underfill layer 197 may serve to fix the first and second semiconductor packages P1 and P2. The underfill layer 197 may be formed of, for example, epoxy or the like, and is not limited thereto. The underfill layer 197 may be omitted in another embodiment.

Figure 11:
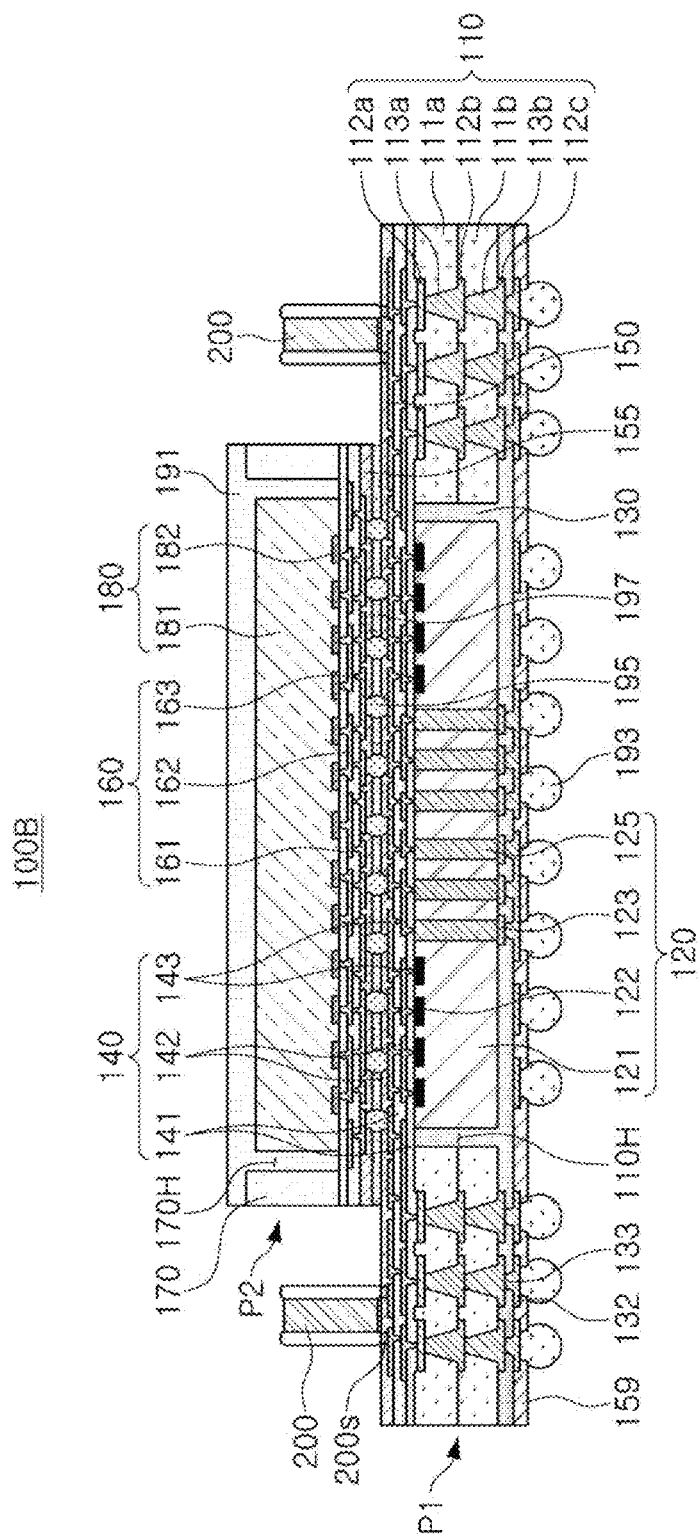
FIG. 11 is a schematic cross-sectional view illustrating another example of a semiconductor package.

FIG. 11 is a schematic cross-sectional view illustrating another example of a semiconductor package.

Referring to FIG. 11, a semiconductor package 100B according to another example may further include one or more passive components 200 disposed on a first connection structure 140. First to third connection pads 122, 123 and 182 may be electrically connected to the passive component 200 depending on function. The passive component 200 may be disposed in a surface mount form by a low melting point metal 200s such as a solder or the like.

The passive component 200 may be a chip-type capacitor such as a multilayer ceramic capacitor (MLCC) or a low inductance chip capacitor (LICC), or a chip-type inductor such as a power inductor. However, the type of the passive component 200 is not limited thereto, and may be other known passive component. That is, the passive component 200 may be a known chip-type passive component. Here, the chip-type component refers to an independent chip-type component having, for example, a body, internal electrodes formed inside the body, and external electrodes formed on the body. A plurality of passive components 200 may be the same or different type of components. The number of passive component 200 is not particularly limited, and may be more or less than that illustrated in the drawing depending on design.

Other structures are substantially the same as those of the semiconductor package 100A and the like as described above, and thus a detailed description thereof is omitted.

Figure 12:
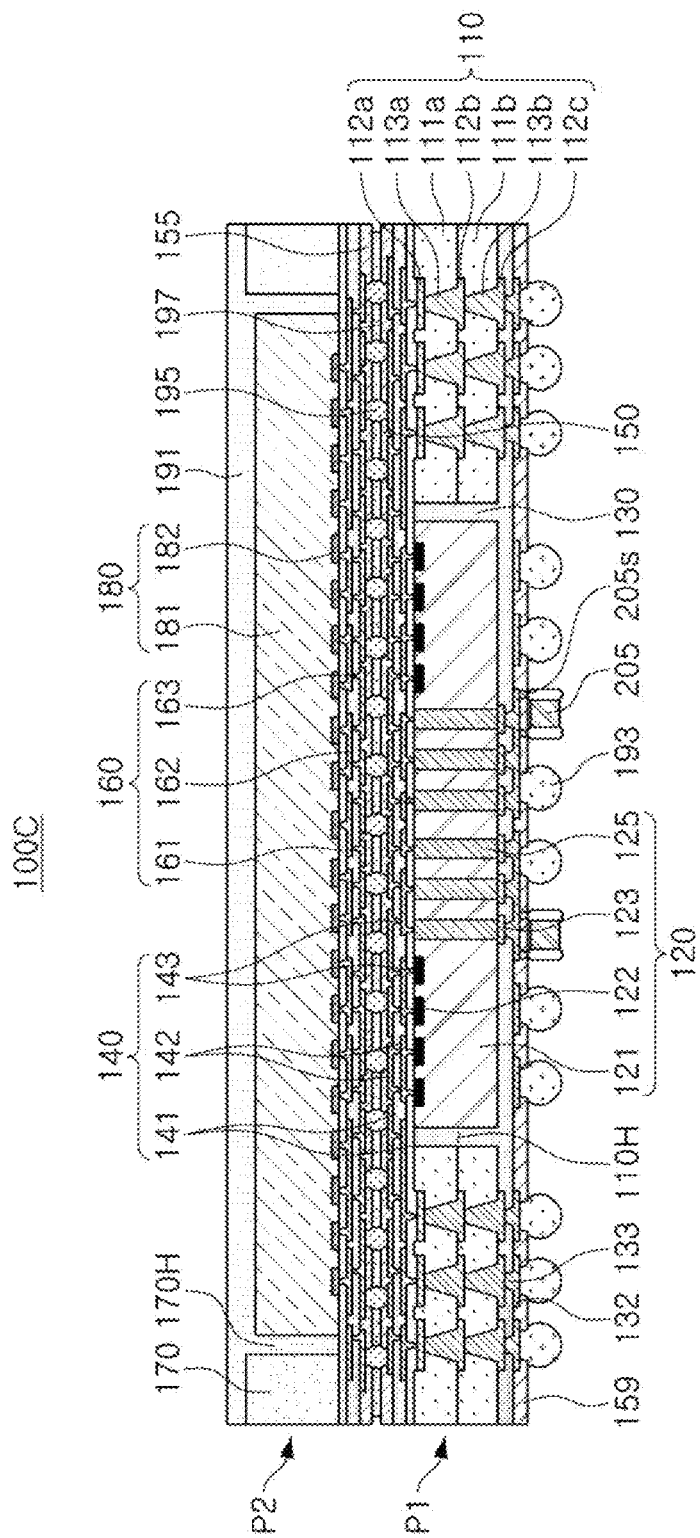
FIG. 12 is a schematic cross-sectional view illustrating another example of a semiconductor package.

FIG. 12 is a schematic cross-sectional view illustrating another example of a semiconductor package.

Referring to FIG. 12, a semiconductor package 100C according to another example may further include one or more passive components 205 disposed on a lower surface of a backside redistribution layer 132. Each of the passive components 205 may be disposed below at least each of a portion of through vias 125 and between the electrical connection metal 193. First to third connection pads 122, 123 and 182 may be electrically connected to the passive components 205 depending on function. The passive component 205 may be disposed in a surface mount form by a low melting point metal 205s such a solder or the like.

The passive component 205 may be a chip-type capacitor such as a land-side capacitor (LSC), a multilayer ceramic capacitor (MLCC), a low inductance chip capacitor (LICC) or a chip-type inductor such as a power inductor. The passive components 205 may be the same or different type components. The number of passive component 205 is not particularly limited, and may be more or less than that illustrated in the drawing depending on design.

Other structures are substantially the same as those of the semiconductor package 100A and the like as described above, and thus a detailed description thereof is omitted. Meanwhile, a particular structure of the semiconductor package 100C described above may also be used for the semiconductor package 100B according to another embodiment.

Figure 13:
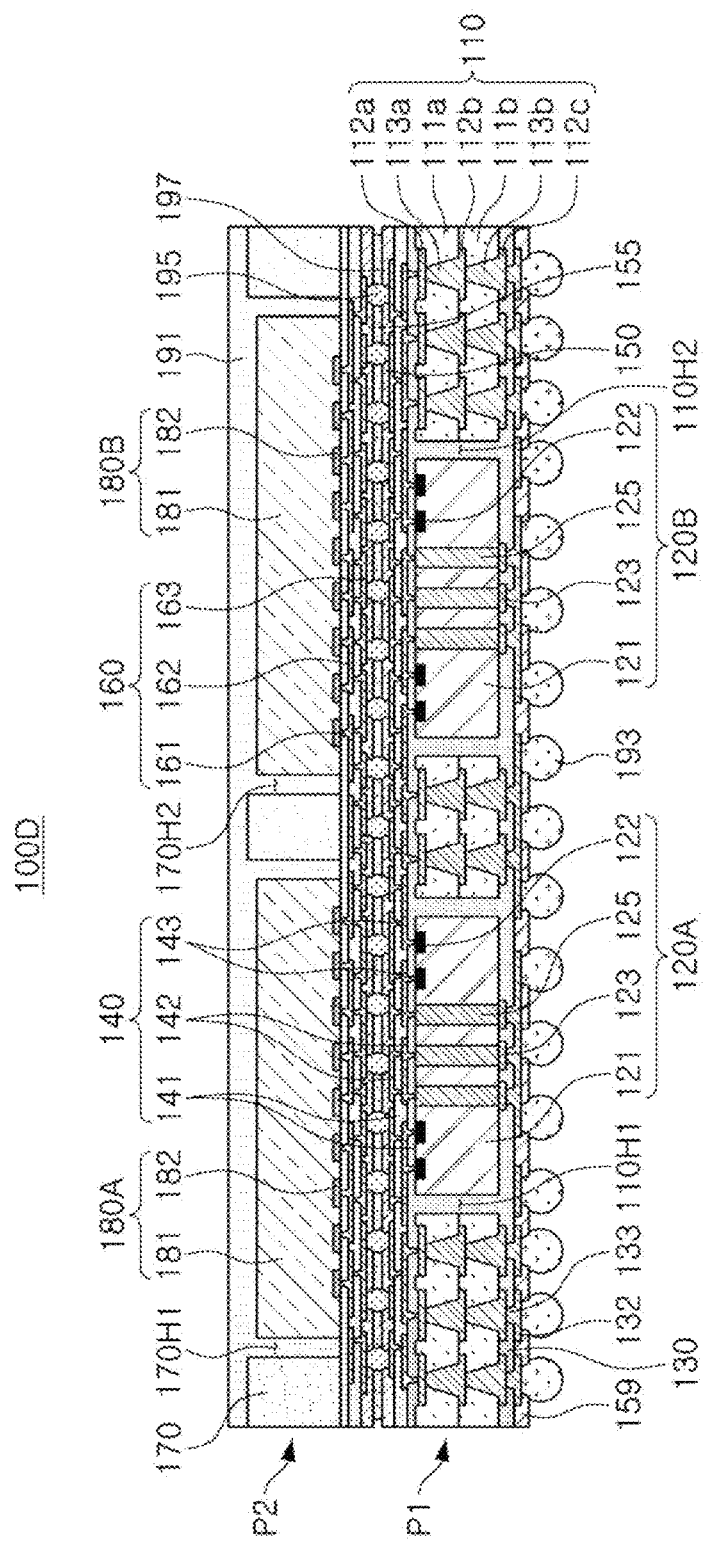
FIG. 13 is a schematic cross-sectional view illustrating another example of a semiconductor package.

FIG. 13 is a schematic cross-sectional view illustrating another example of a semiconductor package.

Referring to FIG. 13, unlike the semiconductor package 100A in FIG. 9, in a semiconductor package 100D according to another example, a first semiconductor package P1 and a second semiconductor package P2 may include a plurality of first semiconductor chips 120A and 120B and a plurality of second semiconductor chips 180A and 180B, respectively. To this end, first and second frames 110 and 170 may respectively have a plurality of first through portions 110H1 and 110H2, and a plurality of second through portions 170H1 and 170H2, which are spaced apart from each other. The plurality of first semiconductor chips 120A and 120B and the plurality of second semiconductor chips 180A and 180B may be respectively disposed so that each pair of the first and second semiconductor chips are at least partially overlapped to each other in a vertical direction. The plurality of second semiconductor chips 180A and 180B may each perform a higher function than the plurality of first semiconductor chips 120A and 120B, and may include semiconductor elements each having a smaller scale than semiconductor elements of the plurality of first semiconductor chips 120A and 120B.

Other structures are substantially the same as those of the semiconductor package 100A and the like as described above, and thus a detailed description thereof is omitted. Meanwhile, a particular structure of the semiconductor package 100D described above may also be used for the semiconductor packages 100B and 100C according to another embodiment.

Figure 14:
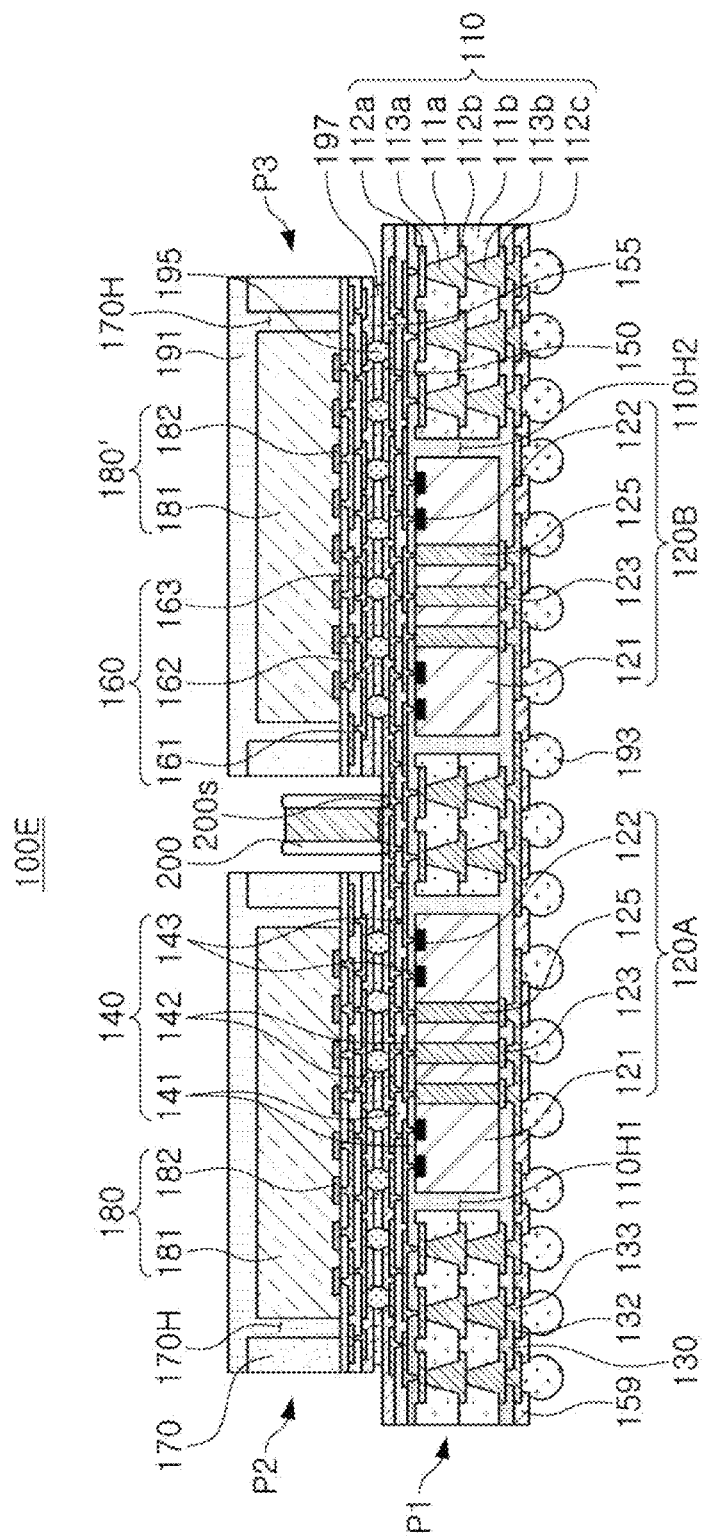
FIG. 14 is a schematic cross-sectional view illustrating another example of a semiconductor package.

FIG. 14 is a schematic cross-sectional view illustrating another example of a semiconductor package.

Referring to FIG. 14, a semiconductor package 100E according to another example may further include a third semiconductor package P3 disposed in parallel with a second semiconductor package P2 which includes a semiconductor chip 180, and including a second semiconductor chip 180'. In addition, a first semiconductor package P1 may include a plurality of first semiconductor chips 120A and 120B and thus, a first frame 110 may have a plurality of first through portions 110H1 and 110H2, which are disposed to be spaced apart from each other. In addition, similar to the semiconductor package 100B in FIG. 11, the semiconductor package 100E may further include one or more passive components 200 disposed on a first connection structure 140.

The third semiconductor package P3 may have substantially the same structure as the second semiconductor package P2. The third semiconductor package P3 may include a second connection structure 160, a second frame 170, the second semiconductor chip 180', a second encapsulant 191, a third passivation layer 155, a connection terminal 195 and an underfill layer 197. The second and third semiconductor packages P2 and P3 may be disposed to vertically overlap at least portions of a plurality of the first semiconductor chips 120A and 120B, respectively. The second semiconductor chips 180 and 180' may each perform a relatively higher function than the plurality of first semiconductor chips 120A and 120B, and may include semiconductor elements each having a smaller scale than semiconductor elements of the plurality of first semiconductor chips 120A and 120B.

The passive component 200 may be disposed between the second semiconductor package P2 and the third semiconductor package P3. In another embodiment, the passive components 200 may be additionally disposed outwardly of each of the second semiconductor package P2 and the third semiconductor package P3.

Other structures are substantially the same as those of the semiconductor packages 100A, 100B, 100D and the like as described above, and thus a detailed description thereof is omitted.

Figure 15:
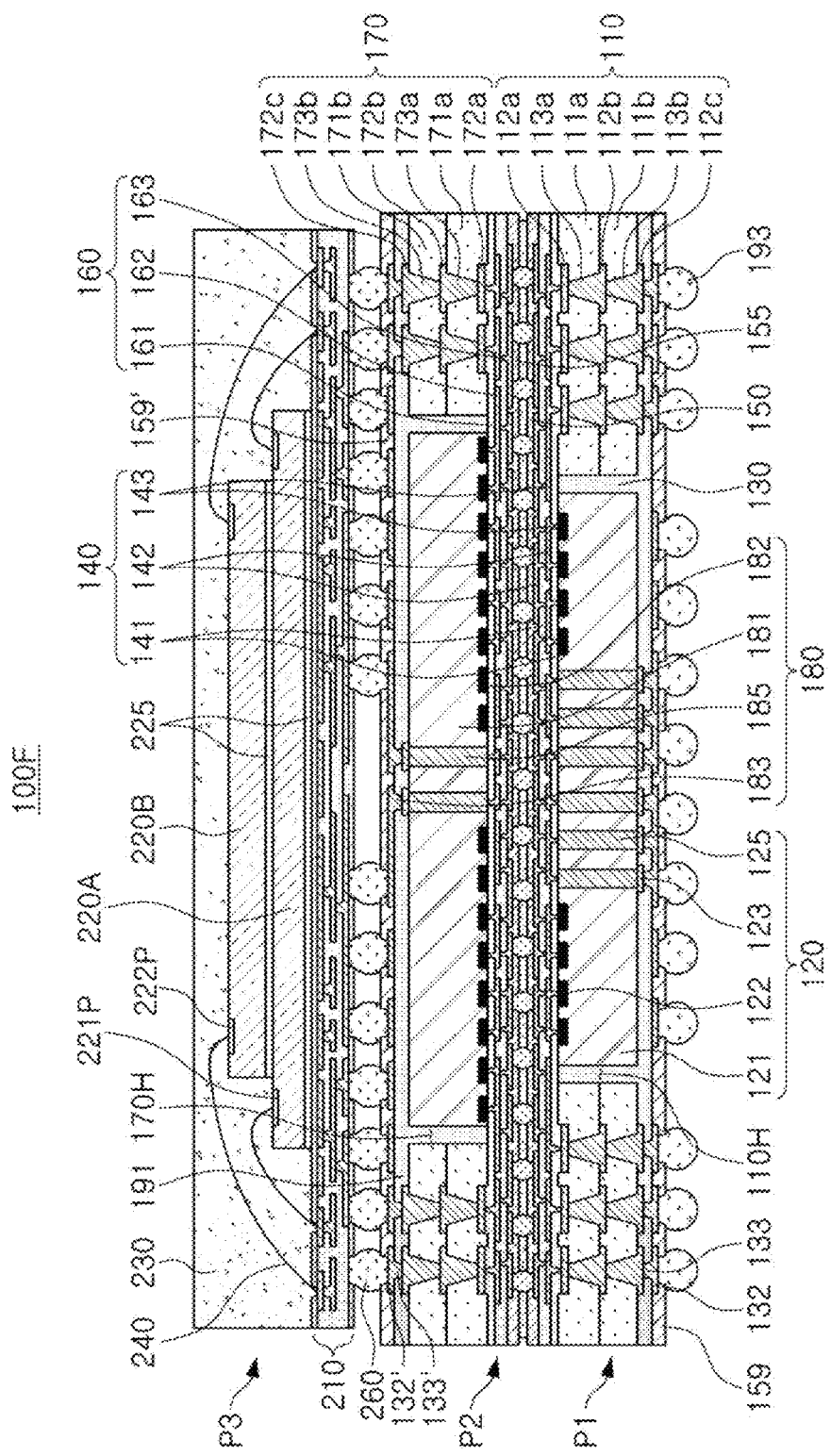
FIG. 15 is a schematic cross-sectional view illustrating another example of a semiconductor package.

FIG. 15 is a schematic cross-sectional view illustrating another example of a semiconductor package.

Referring to FIG. 15, unlike the semiconductor package 100A in FIG. 9, a semiconductor package 100F according to another example may further include a third semiconductor package P3 stacked on top of a second semiconductor package P2 in a vertical direction. In addition, unlike the semiconductor package 100A in FIG. 9, the second semiconductor package P2 may have a structure partially vertically symmetrical to a first semiconductor package P1.

In the second semiconductor package P2, a second frame 170 may have a plurality of insulating layers 171a and 171b, and may further include wiring layers 172a, 172b and 172c, and wiring via layers 173a and 173b. In addition, the second semiconductor package P2 may further include a backside wiring layer 132' and a backside connection via 133' on a second semiconductor chip 180 and may further include a passivation layer 159' covering the backside wiring layer 132'. The second semiconductor chip 180 may further include a fourth connection pad 183 disposed on an inactive surface of the second semiconductor chip 180 and a through via 185 connected to the fourth connection pad 183 in addition to a body 181 and a third connection pad 182.

The third semiconductor package P3 may include a wiring board 210, a plurality of third semiconductor chips 220A and 220B disposed on the wiring board 210, a third encapsulant 230 encapsulating the third semiconductor chips 220A and 220B and an upper connection terminal 260 disposed below the wiring board 210.

The wiring board 210 may be a known printed circuit board (PCB) such as an interposer substrate. The wiring board 210 may include an insulating layer and a conductive wiring layer formed in the insulating layer. A passivation layer or the like may be formed on both sides of the wiring board 210. The structure and a shape of the wiring board 210 may be varied in another embodiment. In addition, in another embodiment, an interposer substrate may be further disposed between the wiring board 210 and the second semiconductor package P2.

The third semiconductor chips 220A and 220B may be stacked vertically. The third semiconductor chips 220A and 220B may be attached to the wiring board 210 and the third semiconductor chip 220A by adhesive members 225, respectively. The third semiconductor chips 220A and 220B may be electrically connected to wiring layers of the wiring board 210 by conductive wires 240 connected to connection pads 221P and 222P, respectively. However, in another embodiment, the lower third semiconductor chip 220A may be flip-chip bonded on the wiring board 210.

The third semiconductor chips 220A and 220B may each be an integrated circuit (IC) in which several hundred to several million or more elements are integrated in a single chip. The IC may be a memory chip such as a volatile memory (such as a dynamic random access memory (DRAM)), a non-volatile memory (such as a read only memory (ROM) and a flash memory) or the like, and is not limited thereto. In the third semiconductor chips 220A and 220B, each active surface may be a surface on which each of the connection pads 221P and 222P is disposed, and each inactive surface may be a surface opposing the active surface. However, in another embodiment, the third semiconductor chips 220A and 220B may be disposed in a face-down type. Each of the semiconductor chips 220A and 220B may be formed on the basis of an active wafer; and in this case, a base material of each of the semiconductor chips may be silicon (Si), germanium (Ge), gallium arsenide (GaAs) or the like. Various circuits may be formed in the third semiconductor chips 220A and 220B. The connection pads 221P and 222P may be used to electrically connect the third semiconductor chips 220A and 220B to other components, respectively; and the connection pads 221P and 222P may each be formed of a conductive material such as aluminum (Al) or the like without any particular limitation.

The adhesive members 225 may easily attach the inactive surfaces of the third semiconductor chips 220A and 220B to an upper surface of the lower wiring board 210 and an upper surface of the third semiconductor chip 220A, respectively. For example, the adhesive member 225 may be a film such as a die attach film (DAF). A material of the adhesive member 225 is not particularly limited. The adhesion member 225 may be formed of, for example, an epoxy component, and is not limited thereto. The third semiconductor chips 220A and 220B may be more stably mounted by the adhesion members 225, and have improved reliabilities, respectively.

The third encapsulant 230 may protect the third semiconductor chips 220A and 220B. An encapsulation form of the third encapsulant 230 is not particularly limited, and may be a form in which the encapsulant 230 encapsulates at least portions of the third semiconductor chips 220A and 220B. For example, the third encapsulant 230 may cover at least portions of the active surfaces of the third semiconductor chips 220A and 220B, and also may cover at least portions of side surfaces of the third semiconductor chips 220A and 220B. The third encapsulant 230 may be formed of an insulating material. The insulating material may be a photoimagable epoxy (PIE), a photoimagable dielectric (PID) material or the like. However, the insulating material is not limited thereto. That is, the insulating material may be a material including an inorganic filler and an insulating resin, for example, a thermosetting resin such as an epoxy resin, a thermoplastic resin such as a polyimide resin, or a resin having a reinforcing material such as an inorganic filler, and more specifically, ABF or the like. In addition, any known molding material such as epoxy molding compounds (EMC) or the like, may also be used. When necessary, a material in which a thermosetting resin or a thermoplastic resin is impregnated in an inorganic filler and/or a core material such as a glass fiber (or a glass cloth or a glass fabric) may also be used as the insulating material.

The upper connection terminal 260 may electrically connect the wiring board 210 and a second connection structure 160 to each other. The upper connection terminal 260 may be interposed between a wiring layer of the wiring board 210 and a second redistribution layer 162 of the second connection structure 160. The upper connection terminal 260 may be formed of a conductive material such as a solder or the like. However this material is only an example, and a material of the upper connection terminal 260 is not particularly limited. The upper connection terminal 260 may have a shape of a land, a ball, a pin or the like.

Other structures are substantially the same as those of the semiconductor packages 100A, 100B, 100D and the like as described above, and thus a detailed description thereof is omitted. Meanwhile, a particular structure of the semiconductor package 100F described above may also be used for the semiconductor packages 100B, 100C, 100D and 100E according to another embodiment.

Figure 16:
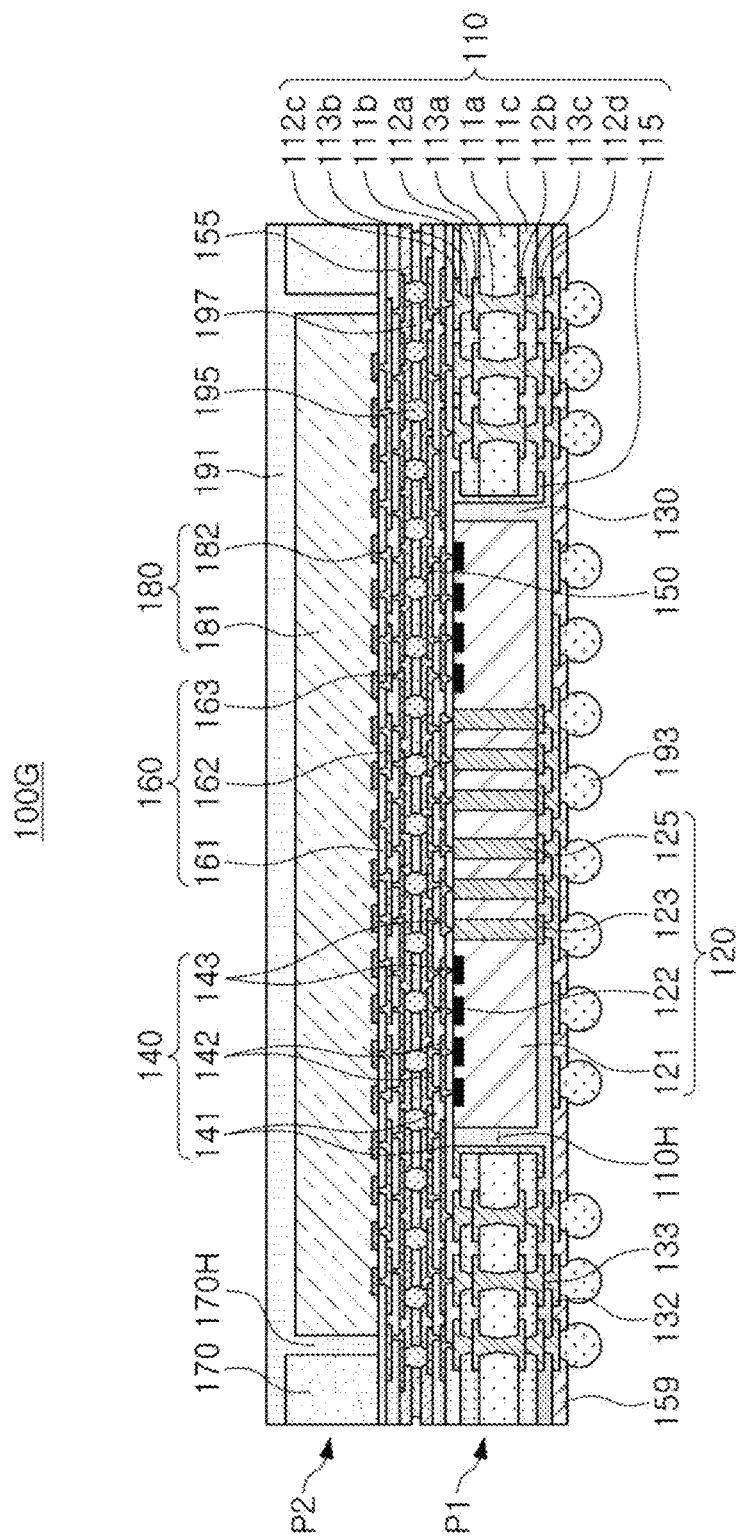
FIG. 16 is a schematic cross-sectional view illustrating another example of a semiconductor package.

FIG. 16 is a schematic cross-sectional view illustrating another example of a semiconductor package.

Referring to FIG. 16, in a semiconductor package 100G according to another example, a first frame 110 may have a different shape. In detail, the first frame 110 may include a first insulating layer 111a, a first wiring layer 112a and a second wiring layer 112b disposed on opposite surfaces of the first insulating layer 111a, respectively, a second insulating layer 111b and a third insulating layer 111c disposed on the opposite surfaces of the first insulating layer 111a and covering the first and second wiring layers 112a and 112b, respectively, a third wiring layer 112c disposed on the other surface of the second insulating layer 111b opposing one surface of the second insulating layer 111b in which the first wiring layer 112a is embedded, a fourth wiring layer 112d disposed on the other surface of the third insulating layer 111c opposing one surface of the third insulating layer 111c in which the second wiring layer 112b is embedded, a first wiring via layer 113a penetrating through the first insulating layer 111a and electrically connecting the first and second wiring layers 112a and 112b to each other, a second wiring via layer 113b penetrating through the second insulating layer 111b and electrically connecting the first and third wiring layers 112a and 112c to each other, and a third wiring via layer 113c penetrating through the third insulating layer 111c and electrically connecting the second and fourth wiring layers 112b and 112d to each other. The first frame 110 may include a greater number of wiring layers 112a, 112b, 112c and 112d, and thus a connection structure 140 may further be simplified.

The first insulating layer 111a may have a greater thickness than those of the second insulating layer 111b and the third insulating layer 111c. The first insulating layer 111a may have the greater thickness in order to basically maintain rigidity, and the second insulating layer 111b and the third insulating layer 111c may be used to form a greater number of wiring layers 112c and 112d. Likewise, a wiring via of the first wiring via layer 113a penetrating through the first insulating layer 111a may have a height and/or an average diameter greater than the second and third wiring via layers 113b and 113c penetrating through the second and third insulating layers 111b and 111c, respectively. In addition, the wiring via of the first wiring via layer 113a may have an hourglass shape or a cylindrical shape, whereas the wiring vias of the second and third wiring via layers 113b and 113c may have tapered shapes of which tapered directions are opposite to each other. The first to fourth wiring layers 112a, 112b, 112c and 112d may have thicknesses greater than a first redistribution layer 142.

When necessary, a metal layer 115 may be further disposed on a wall surface of a first through portion 110H of the first frame 110, and the metal layer 115 may cover the entire wall surface. The metal layer 115 may include a metallic material such as copper (Cu) or the like. The first semiconductor chip 120 may have improved electromagnetic wave shielding effect and heat radiating effect due to the metal layer 115.

Other structures are substantially the same as those of the semiconductor packages 100A and the like as described above, and thus a detailed description thereof is omitted. Meanwhile, a particular structure of the semiconductor package 100G described above may also be used for the semiconductor packages 100B, 100C, 100D, 100E and 100F according to another embodiment.

As set forth above, according to an embodiment in the present disclosure, there is provided the package structure in which the plurality of semiconductor chips may be packaged to have the optimal signal and power characteristics.

While embodiments have been shown and described above, it is apparent to those skilled in the art that modifications and variations could be made without departing from the scope of the present invention as defined by the appended claims.

What is claimed is:
1. A semiconductor package comprising:
a first semiconductor package including:
   a first frame having a first through portion,
   a first semiconductor chip disposed in the first through portion of the first frame and having a first surface on which a first connection pad is disposed, a second surface opposing the first surface and on which a second connection pad is disposed, and a first through via connected to the second connection pad, wherein the first through via is different from and spaced apart from the first connection pad,
   a first connection structure disposed on the first surface of the first semiconductor chip and including a first redistribution layer connected to the first connection pad of the first semiconductor chip,
   a first encapsulant disposed in the first through portion to separate the first semiconductor chip from the first frame, and extending on the first frame and on the second surface of the first semiconductor chip, and
   a backside redistribution layer disposed on the first encapsulant and connected to the second connection pad of the first semiconductor chip;
a second semiconductor package disposed on the first semiconductor package and including:
   a second connection structure including a second redistribution layer connected to the first redistribution layer,
   a second frame disposed on the second connection structure and having a second through portion, and
   a second semiconductor chip disposed in a second through portion of the second frame and having a third surface on which a third connection pad is disposed, the third connection pad connected to the second redistribution layer;
a plurality of connection terminals disposed between the first connection structure and the second connection structure and connecting the first redistribution layers and the second redistribution layers to each other; and
an underfill layer disposed between the first connection structure and the second connection structure to cover at least portions of the plurality of connection terminals,
wherein the first frame includes a wiring structure connecting the first redistribution layer and the backside redistribution layer to each other, and
vias of the wiring structure have a tapered shape such that an upper surface of the tapered shape has a width smaller than a width of a lower surface of the tapered shape, the upper surface of the tapered shape being closer to the second semiconductor package than the lower surface of the tapered shape.
2. The semiconductor package of claim 1,
wherein in the first semiconductor chip, the first connection pad is connected to a signal pattern of the first redistribution layer, and
the second connection pad is connected to at least one of a power pattern and a ground pattern of the backside redistribution layer.

3. The semiconductor package of claim 1, wherein the signal pattern of the first redistribution layer is connected to the backside redistribution layer through the wiring structure.

4. The semiconductor package of claim 1, wherein the first connection pad and the third connection pad face each other.

5. The semiconductor package of claim 1,
wherein the first connection structure further includes a first connection via connected to the first redistribution layer, and
the first through via is connected to the first redistribution layer through the first connection via at one end of the first through via opposing another end of the first through via on which the first through via is connected to the second connection pad.

6. The semiconductor package of claim 1, wherein the first through via of the first semiconductor chip extends from the second connection pad to the first surface or a region adjacent to the first surface by penetrating through the first semiconductor chip.

7. The semiconductor package of claim 1, wherein the first and second semiconductor chips each implement a partial or entire function of an application processor (AP).

8. The semiconductor package of claim 1,
wherein the first semiconductor chip includes a first semiconductor element having a first critical dimension, and
the second semiconductor chip includes a second semiconductor element having a second critical dimension, smaller than the first critical dimension.

9. The semiconductor package of claim 1, further comprising a passive component disposed on the first connection structure with the second semiconductor package.

10. The semiconductor package of claim 1, further comprising a passive component disposed below the first through via and on a lower surface of the backside redistribution layer,
wherein at least a portion of the passive component is overlapped with the first through via in an extending direction of the first through via.

11. The semiconductor package of claim 1,
wherein the first frame has a plurality of the first through portions, and
a plurality of first semiconductor chips are disposed in the first through portions, respectively.

12. The semiconductor package of claim 11,
wherein the second frame has a plurality of the second through portions, and
a plurality of second semiconductor chips are disposed in the second through portions, respectively.

13. The semiconductor package of claim 1, further comprising a third semiconductor package disposed on the first semiconductor package with the second semiconductor package, and having substantially the same structure as the second semiconductor package.

14. The semiconductor package of claim 13, further comprising a passive component disposed between the second semiconductor package and the third semiconductor package and on the first connection structure.

15. The semiconductor package of claim 1, wherein the second semiconductor chip further includes a fourth connection pad disposed on a fourth surface opposing the third surface on which the third connection pad is disposed, and a second through via connected to the fourth connection pad.

16. The semiconductor package of claim 15, wherein the second through via is disposed in a region of the second semiconductor chip overlapping the first through via, and
the first and second through vias are connected to one of a power pattern or a ground pattern of the backside redistribution layer.

17. The semiconductor package of claim 1, further comprising a third semiconductor package disposed on the second semiconductor package, and including a wiring board connected to the second redistribution layer through an upper connection terminal and at least one third semiconductor chip disposed on the wiring board.

18. A semiconductor package comprising:
a first semiconductor package including:
a first frame having a first through portion,
a first semiconductor chip disposed in the first through portion of the first frame and having a first surface on which a first connection pad is disposed, a second surface opposing the first surface and on which a second connection pad is disposed, and a through via connected to the second connection pad, wherein the through via is different from and spaced apart from the first connection pad,
a first connection structure disposed on the first surface of the first semiconductor chip and including a first redistribution layer connected to the first connection pad of the first semiconductor chip, and
a backside redistribution layer disposed on the second surface of the first semiconductor chip and connected to the second connection pad of the first semiconductor chip; and
a second semiconductor package disposed on the first semiconductor package and including:
a second connection structure including a second redistribution layer connected to the first redistribution layer,
a second frame disposed on the second connection structure and having a second through portion,
a second semiconductor chip disposed in a second through portion of the second frame and having a third surface on which a third connection pad is disposed, the third connection pad connected to the second redistribution layer, and
a second encapsulant disposed in the second through portion to separate the second semiconductor chip from the second frame, and extending on the first frame and on a fourth surface of the second semiconductor chip opposing the third surface,
wherein a first connection via of the first connection structure is tapered in a direction from the second semiconductor package to the first semiconductor package, and a second connection via of the second connection structure is tapered in a direction from the first semiconductor package to the second semiconductor package.

19. The semiconductor package of claim 18, wherein the first semiconductor chip includes a first semiconductor element having a first critical dimension, and
the second semiconductor chip includes a second semiconductor element having a second critical dimension, smaller than the first critical dimension.

20. A semiconductor package comprising:
a first semiconductor package including:
a first frame having a first through portion,
a first semiconductor chip disposed in the first through portion of the first frame and having a first surface on which a first connection pad is disposed, a second surface opposing the first surface and on which a second connection pad is disposed, and a first through via connected to the second connection pad, wherein the first through via is different from and spaced apart from the first connection pad, a first connection structure disposed on the first surface of the first semiconductor chip and including a first redistribution layer connected to the first connection pad of the first semiconductor chip, and a backside redistribution layer disposed on the second surface of the first semiconductor chip and connected to the second connection pad of the first semiconductor chip;

a second semiconductor package disposed on the first semiconductor package and including:

a second connection structure including a second redistribution layer connected to the first redistribution layer, a second frame disposed on the second connection structure and having a second through portion, and a second semiconductor chip disposed in a second through portion of the second frame and having a third surface on which a third connection pad is disposed, the third connection pad connected to the second redistribution layer; and a passive component disposed below the first through via and on a lower surface of the backside redistribution layer, wherein at least a portion of the passive component is overlapped with the first through via in an extending direction of the first through via.

21. The semiconductor package of claim 20, wherein the first semiconductor chip is spaced apart from the first frame and the second semiconductor chip is spaced apart from the second frame.

* * * * *